(12) United States Patent
Kinuta

(10) Patent No.: US 12,170,458 B2
(45) Date of Patent: Dec. 17, 2024

(54) UNINTERRUPTIBLE POWER SUPPLY DEVICE

(71) Applicant: FUJI ELECTRIC CO., LTD., Kawasaki (JP)

(72) Inventor: Takahiro Kinuta, Hino (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 54 days.

(21) Appl. No.: 17/972,011

(22) Filed: Oct. 24, 2022

(65) Prior Publication Data

US 2023/0038103 A1 Feb. 9, 2023

Related U.S. Application Data

(63) Continuation of application No. PCT/JP2021/039146, filed on Oct. 22, 2021.

(30) Foreign Application Priority Data

Nov. 12, 2020 (JP) ................. 2020-188994

(51) Int. Cl.
| | | |
|---|---|---|
| H02J 9/00 | (2006.01) | |
| H02J 9/06 | (2006.01) | |
| H02M 7/48 | (2007.01) | |
| H02M 7/537 | (2006.01) | |
| H05K 5/02 | (2006.01) | |
| H05K 7/02 | (2006.01) | |

(52) U.S. Cl.
CPC ............. H02J 9/062 (2013.01); H02M 7/537 (2013.01); H05K 5/0247 (2013.01); H05K 7/02 (2013.01)

(58) Field of Classification Search
CPC ........ H02J 9/062; H02M 7/537; H02M 3/003; H02M 7/003; H05K 5/0247; H05K 7/02

USPC .......................................................... 307/65
See application file for complete search history.

(56) References Cited

U.S. PATENT DOCUMENTS

2016/0226301 A1    8/2016 Lee et al.
2017/0300100 A1*  10/2017 Takeuchi ............. H05K 7/1492
(Continued)

FOREIGN PATENT DOCUMENTS

| JP | 2016-144355 A | 8/2016 |
| WO | 2018030035 A1 | 2/2018 |
| WO | 2020060061 A1 | 3/2020 |

OTHER PUBLICATIONS

PCT/ISA/210, "International Search Report for PCT International Application No. PCT/JP2021/039146," Nov. 22, 2021.
(Continued)

Primary Examiner — Rexford N Barnie
Assistant Examiner — Xuan Ly
(74) Attorney, Agent, or Firm — HAUPTMAN HAM, LLP

(57) ABSTRACT

This uninterruptible power supply device includes an input module provided with a plurality of conductor wires having a plate shape including at least a plurality of AC input wires, and an uninterruptible power supply module. In addition, the plurality of AC input wires each extend in an X direction in which the uninterruptible power supply module and the input module are adjacent to each other, and have AC input cable attachment portions in which an AC input cable is attached. The AC input cable attachment portions are disposed so as to be separated from each other in a Y direction, which is a direction in which a front side and a rear side of the input module face each other.

13 Claims, 19 Drawing Sheets

(56) References Cited

U.S. PATENT DOCUMENTS

2019/0165552 A1\* 5/2019 Kin .................... H05K 7/1432
2021/0384711 A1\* 12/2021 Kwon .................. H02M 7/003

OTHER PUBLICATIONS

PCT/ISA/237, "Written Opinion for PCT International Application No. PCT/JP2021/039146," Nov. 22, 2021.
Japan Patent Office, "Office Action for Japanese Patent Application 2021-167667," Jun. 28, 2022.

\* cited by examiner

UNINTERRUPTIBLE POWER SUPPLY DEVICE

CROSS-REFERENCE TO RELATED APPLICATION

This application is a continuation of PCT application PCT/JP2021/039146, filed on Oct. 22, 2021, claiming a priority of Japanese Patent Application No. 2020-188994 filed on Nov. 12, 2020, the disclosure of which is incorporated herein.

BACKGROUND OF THE INVENTION

Field of the Invention

The present invention relates to an uninterruptible power supply device, and more particularly to an uninterruptible power supply device including a plurality of uninterruptible power supply modules.

Description of the Background Art

In the related art, an uninterruptible power supply device including a plurality of uninterruptible power supply modules is known. Such an uninterruptible power supply device is disclosed in, for example, Japanese Patent Application Publication No. 2016-144355.

The Japanese Patent Application Publication No. 2016-144355 discloses an uninterruptible power supply device including a plurality of uninterruptible power supply modules. In the uninterruptible power supply device described in Japanese Patent Application Publication No. 2016-144355, a plurality of uninterruptible power supply modules is disposed side by side with each other. A plurality of uninterruptible power supply modules is connected in parallel between an AC power supply outside the device and a load.

Here, although not specified in Japanese Patent Application Publication No. 2016-144355, in an uninterruptible power supply device in the related art as described in Japanese Patent Application Publication No. 2016-144355, a module for input (input module) may be provided between an AC power supply outside the device and a plurality of uninterruptible power supply modules in order to input electric power received from the AC power supply outside the device to the plurality of uninterruptible power supply modules.

In the uninterruptible power supply device in the related art as described in Japanese Patent Application Publication No. 2016-144355, when the input module is provided, the width of the entire uninterruptible power supply device increases in the direction in which the plurality of uninterruptible power supply modules and the input module are adjacent to each other. Therefore, there is a demand for an uninterruptible power supply device capable of suppressing an increase in the width of the entire uninterruptible power supply device in a direction in which a plurality of uninterruptible power supply modules and an input module are adjacent to each other.

SUMMARY OF THE INVENTION

The present invention has been made to solve the above-mentioned problems, and one object of the present invention is to provide an uninterruptible power supply device capable of suppressing an increase in the width of the entire uninterruptible power supply device in a direction in which a plurality of uninterruptible power supply modules and an input module are adjacent to each other.

In order to achieve the above object, according to one aspect of the present invention, there is provided an uninterruptible power supply device including: an input module provided with a plurality of conductor wires having a plate shape and including a plurality of AC input wires provided at least in correspondence with phases of electric power supplied from an AC power supply outside a device; and a plurality of uninterruptible power supply modules each including a power conversion unit that converts electric power received from the AC power supply outside the device via the plurality of AC input wires and outputs the converted electric power to a load outside the device, in which the plurality of AC input wires each extend in a first direction in which the plurality of uninterruptible power supply modules and the input module are adjacent to each other, and have AC input cable attachment portions to which an AC input cable electrically connected to the AC power supply outside the device is attached, and the AC input cable attachment portions are disposed so as to be separated from each other in a second direction, which is a direction in which a front side and a rear side of the input module face each other.

Here, the AC input cable attachment portions need to be separated from each other by the aerial insulation distance in order to prevent a short circuit. However, in the uninterruptible power supply device according to the above one aspect, the AC input cable attachment portions are disposed so as to be separated from each other in the second direction, which is a direction in which the front side and the rear side of the input module face each other. Thereby, unlike the case where the AC input cable attachment portions are separated from each other in the first direction in which the plurality of uninterruptible power supply modules and the input module are adjacent to each other, it is possible to suppress an increase in the width of the input module in the first direction. As a result, it is possible to suppress an increase in the width of the entire uninterruptible power supply device in the direction (first direction) in which the plurality of uninterruptible power supply modules and the input modules are adjacent to each other.

In the uninterruptible power supply device according to the above one aspect, preferably, the plurality of conductor wires having a plate shape further includes a plurality of DC input wires provided in correspondence with phases of electric power supplied from a battery outside the device, the plurality of DC input wires each extends in the first direction and has DC input cable attachment portions to which a DC input cable electrically connected to the battery outside the device is attached, and the DC input cable attachment portions are disposed so as to be separated from each other in the second direction. With this configuration, unlike the case where the DC input cable attachment portions are separated from each other in the first direction in which the plurality of uninterruptible power supply modules and the input module are adjacent to each other, it is possible to suppress an increase in the width of the input module in the first direction. As a result, it is possible to suppress an increase in the width of the entire uninterruptible power supply device in the first direction in which the plurality of uninterruptible power supply modules and the input modules are adjacent to each other.

In this case, preferably, the DC input cable attachment portion of each of the plurality of DC input wires is disposed so as to be offset in the second direction with respect to the AC input cable attachment portion of each of the plurality of AC input wires. With this configuration, since the DC input cable attachment portion is disposed so as to be offset in the second direction, which is a direction in which the front side and the rear side of the input module face each other, with respect to the AC input cable attachment portion, the DC input cable can be easily attached or detached. As a result, workability at the time of installation and maintenance of the device can be improved.

In the uninterruptible power supply device according to the above one aspect, preferably, the AC input cable attachment portion of each of the plurality of AC input wires is disposed so as to be offset in a vertical direction with respect to the DC input cable attachment portion of each of the plurality of DC input wires. With this configuration, the AC input cable attachment portion of each of the plurality of AC input wires and the DC input cable attachment portion of each of the plurality of DC input wires can be more easily accessed from the front side of the input module. Therefore, the AC input cable can be more easily attached or detached, and the DC input cable can be more easily attached or detached. As a result, workability at the time of installation and maintenance of the device can be further improved. Further, since the AC input cable attachment portion is disposed so as to be offset in the vertical direction with respect to the DC input cable attachment portion, unlike the case where the AC input cable attachment portion is disposed so as to be offset in the first direction with respect to the DC input cable attachment portion, it is possible to suppress an increase in the width of the input module in the first direction. As a result, it is possible to suppress an increase in the width of the entire uninterruptible power supply device in the first direction in which the plurality of uninterruptible power supply modules and the input modules are adjacent to each other.

Preferably, the uninterruptible power supply device according to the above one aspect further includes a bypass module provided with a plurality of bypass wires provided in correspondence with phases of electric power supplied from a bypass power supply AC power supply outside the device to output the electric power from the bypass power supply AC power supply to the load outside the device not via the power conversion unit, the plurality of conductor wires having a plate shape further includes a plurality of bypass input wires provided in correspondence with the plurality of bypass wires, the plurality of bypass input wires each extends in the first direction and has bypass input cable attachment portions to which a bypass input cable electrically connected to the bypass power supply AC power supply outside the device is attached, and the bypass input cable attachment portions are disposed so as to be separated from each other in the second direction. With this configuration, unlike the case where the bypass input cable attachment portions are separated from each other in the first direction in which the plurality of uninterruptible power supply modules and the input module are adjacent to each other, it is possible to suppress an increase in the width of the input module in the first direction. As a result, it is possible to suppress an increase in the width of the entire uninterruptible power supply device in the first direction in which the plurality of uninterruptible power supply modules and the input modules are adjacent to each other.

In this case, preferably, the bypass input cable attachment portion of each of the plurality of bypass input wires is disposed so as to be offset in the second direction with respect to the DC input cable attachment portion of each of the plurality of DC input wires. With this configuration, since the bypass input cable attachment portion is disposed so as to be offset in the second direction, which is a direction in which the front side and the rear side of the input module face each other, with respect to the DC input cable attachment portion, the bypass input cable can be easily attached or detached. As a result, workability at the time of installation and maintenance of the device can be improved.

In the uninterruptible power supply device according to the above one aspect, preferably, the DC input cable attachment portions of each of the plurality of DC input wires are disposed so as to be offset in a vertical direction. With this configuration, each of the DC input cable attachment portions can be easily accessed from the front side of the input module. Therefore, the DC input cable can be more easily attached or detached. As a result, workability at the time of installation and maintenance of the device can be further improved. Further, since the DC input cable attachment portions of the plurality of DC input wires are disposed so as to be offset in the vertical direction, unlike the case where the DC input cable attachment portions are disposed so as to be offset in the first direction, it is possible to suppress an increase in the width of the input module in the first direction. As a result, it is possible to suppress an increase in the width of the entire uninterruptible power supply device in the first direction in which the plurality of uninterruptible power supply modules and the input modules are adjacent to each other.

In the uninterruptible power supply device according to the above one aspect, preferably, the plurality of uninterruptible power supply modules includes a plurality of one-sided uninterruptible power supply modules disposed on one side of the input module in the first direction, and a plurality of other-sided uninterruptible power supply modules disposed on the other side of the input module in the first direction, the plurality of AC input wires is electrically connected to a one-sided power conversion unit which is the power conversion unit of each of the plurality of one-sided uninterruptible power supply modules, and an other-sided power conversion unit which is the power conversion unit of each of the plurality of other-sided uninterruptible power supply modules, and the electric power from the AC power supply outside the device is configured to be input to each of the one-sided power conversion unit and the other-sided power conversion unit via the AC input cable attachment portion extending from the one side to the other side of each of the plurality of AC input wires. With this configuration, by passing through the AC input cable attachment portion extending from one side to the other side of each of the plurality of AC input wires, electric power from the AC power supply outside the device can be easily supplied (input) to any of the power conversion units (one-sided power conversion units and the other-sided power conversion units) of the uninterruptible power supply modules disposed on one side or the other side in the first direction of the input module. As a result, even when the uninterruptible power supply module is disposed on either one side or the other side in the first direction of the input module, the electric power from the AC power supply outside the device can be easily supplied (input) to the power conversion unit of the disposed uninterruptible power supply module. Here, when a plurality of uninterruptible power supply modules is connected in parallel between the AC power supply and the load outside the device, the electric power from the AC power supply outside the device is supplied to the power conversion units of the plurality of uninterruptible power supply modules via common wires (busbars) for AC input. Therefore, the busbar for AC input becomes large in order to pass a large amount of electric power. On the other hand, in the present invention, by configuring as described above, the plurality of one-sided uninterruptible power supply modules is disposed on one side of the input module in the first direction, and the plurality of other-sided uninterruptible power supply modules is disposed on the other side of the input module in the first direction. Thereby, the electric power from AC power supply outside the device can be divided into the busbars for AC input on one side and the busbars for AC input on the other side in the first direction of the input module. As a result, as compared with the case where the plurality of uninterruptible power supply modules is disposed only on one side or the other side of the input module, it is possible to suppress an increase in size of the busbars for AC input of the plurality of uninterruptible power supply modules.

In this case, preferably, the plurality of DC input wires is electrically connected to the one-sided power conversion unit of each of the plurality of one-sided uninterruptible power supply modules, and the other-sided power conversion unit of each of the plurality of other-sided uninterruptible power supply modules, and the electric power from the battery outside the device is configured to be input to each of the one-sided power conversion unit and the other-sided power conversion unit via the DC input cable attachment portion extending from the one side to the other side of each of the plurality of DC input wires. With this configuration, by passing through the DC input cable attachment portion extending from one side to the other side of each of the plurality of DC input wires, electric power from the battery outside the device can be easily supplied (input) to any of the power conversion units (one-sided power conversion units and the other-sided power conversion units) of the uninterruptible power supply modules disposed on one side or the other side in the first direction of the input module. As a result, even when the uninterruptible power supply module is disposed on either one side or the other side of the input module, the electric power from the battery outside the device can be easily supplied (input) to the power conversion unit of the disposed uninterruptible power supply module.

In the uninterruptible power supply device according to the above one aspect, preferably, a plurality of the bypass modules is provided, the plurality of bypass modules includes a one-sided bypass module disposed between the input module and the plurality of one-sided uninterruptible power supply modules, and an other-sided bypass module disposed between the input module and the plurality of other-sided uninterruptible power supply modules, the plurality of bypass input wires is electrically connected to a plurality of one-sided bypass wires of the one-sided bypass module as the plurality of bypass wires and a plurality of other-sided bypass wires of the other-sided bypass module as the plurality of bypass wires, and the electric power from the bypass power supply AC power supply outside the device is configured to be input to each of the plurality of one-sided bypass wires and the plurality of other-sided bypass wires via the bypass input cable attachment portion extending from the one side to the other side of each of the plurality of bypass input wires. With this configuration, by passing through the bypass input cable attachment portion extending from the one side to the other side of each of the plurality of bypass input wires, the electric power from the bypass power supply AC power supply outside the device can be easily supplied (input) to any of the plurality of bypass wires (the plurality of one-sided bypass wires and the plurality of other-sided bypass wires) of the one-sided bypass module disposed on one side of the input module in the first direction and the other-sided bypass module disposed on the other side of the input module in the first direction. As a result, even when the bypass module is disposed on either one side or the other side of the input module, the electric power from the bypass power supply AC power supply outside the device can be easily supplied (input) to the disposed bypass module.

In this case, preferably, the plurality of conductor wires having a plate shape further includes a plurality of AC output wires that is converted by the one-sided power conversion unit and the other-sided power conversion unit and that is provided in correspondence with phases of the output electric power, the plurality of AC output wires each extends in the first direction and has output cable attachment portions to which an output cable electrically connected to the load outside the device is attached, and the output cable attachment portions of each of the plurality of AC output wires are disposed so as to be separated from each other in the second direction. With this configuration, as compared with the case where the output cable attachment portions are separated from each other in the first direction in which the plurality of uninterruptible power supply modules and the input module are adjacent to each other, it is possible to suppress an increase in the width of the input module in the first direction. As a result, it is possible to suppress an increase in the width of the entire uninterruptible power supply device in the first direction in which the plurality of uninterruptible power supply modules and the input modules are adjacent to each other.

In the configuration in which the plurality of conductor wires having a plate shape includes a plurality of AC output wires, preferably, the output cable attachment portion of each of the plurality of AC output wires is disposed so as to be offset in the second direction with respect to the AC input cable attachment portion of each of the plurality of AC input wires and the bypass input cable attachment portion of each of the plurality of bypass input wires. With this configuration, since the output cable attachment portion is disposed so as to be offset in the second direction, which is a direction in which the front side and the rear side of the input module face each other, with respect to the AC input cable attachment portion and the bypass input cable attachment portion, the output cable can be easily attached or detached. As a result, workability at the time of installation and maintenance of the device can be improved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments embodying the present invention will be described below with reference to the drawings.

First Embodiment

With reference to FIGS. 1 to 11, the overall configuration of an uninterruptible power supply device (uninterruptible power supply: UPS or power conditioning system: PCS) 100 according to a first embodiment of the present invention will be described.

(Overall Configuration of Uninterruptible Power Supply Device)

The uninterruptible power supply device 100 includes an input module 1 and uninterruptible power supply modules 2, 3, 4, and 5. The uninterruptible power supply modules 2 to 5 are examples of a "plurality of uninterruptible power supply modules" in the claims. Further, in the first embodiment, the uninterruptible power supply device 100 includes bypass modules 6 and 7. Further, the bypass modules 6 and 7 are examples of a "plurality of bypass modules" in the claims.

Figure 1:
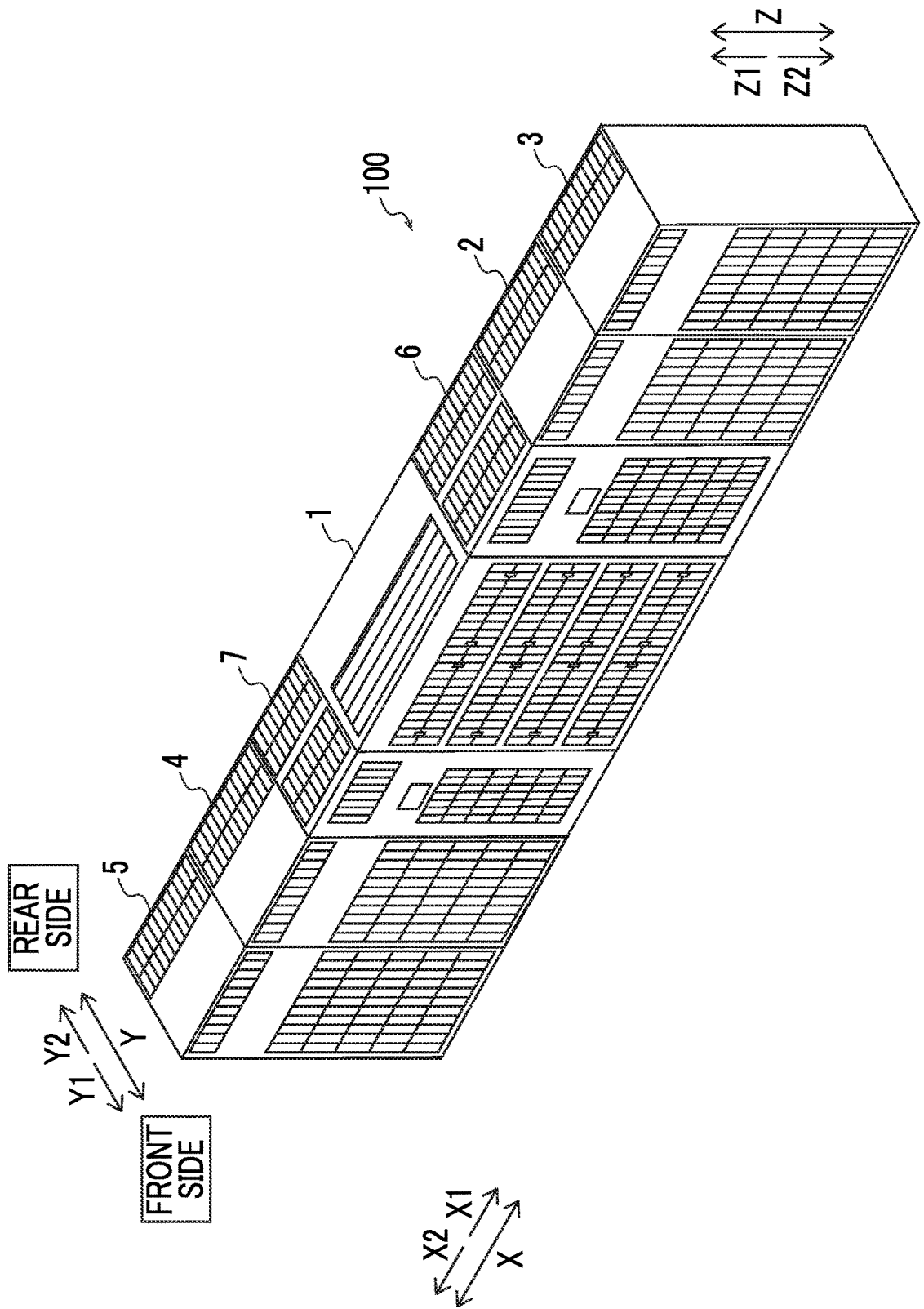
FIG. 1 is a perspective view showing an uninterruptible power supply device according to a first embodiment of the present invention.

As shown in FIG. 1, in the uninterruptible power supply device 100 according to the first embodiment, the uninterruptible power supply module 5, the uninterruptible power supply module 4, the bypass module 7, the input module 1, the bypass module 6, the uninterruptible power supply module 2, and the uninterruptible power supply module 3 are disposed in this order from an X2 direction side in an X direction. Further, the X direction is an example of a "first direction" in the claims.

As shown in FIG. 1, the uninterruptible power supply modules 2 and 3 are disposed on an X1 direction side (one side) of the input module 1. The uninterruptible power supply modules 2 and 3 are examples of a "plurality of one-sided uninterruptible power supply modules" in the claims.

As shown in FIG. 1, the uninterruptible power supply modules 4 and 5 are disposed on the X2 direction side (the other side) of the input module 1. The uninterruptible power supply modules 4 and 5 are examples of a "plurality of other-sided uninterruptible power supply modules" in the claims.

As shown in FIG. 1, the bypass module 6 is disposed between the input module 1 and the uninterruptible power supply module 2 (uninterruptible power supply module 3). The bypass module 6 is an example of a "one-sided bypass module" in the claims.

As shown in FIG. 1, the bypass module 7 is disposed between the input module 1 and the uninterruptible power supply module 4 (uninterruptible power supply module 5). The bypass module 7 is an example of an "other-sided bypass module" in the claims.

Figure 2:
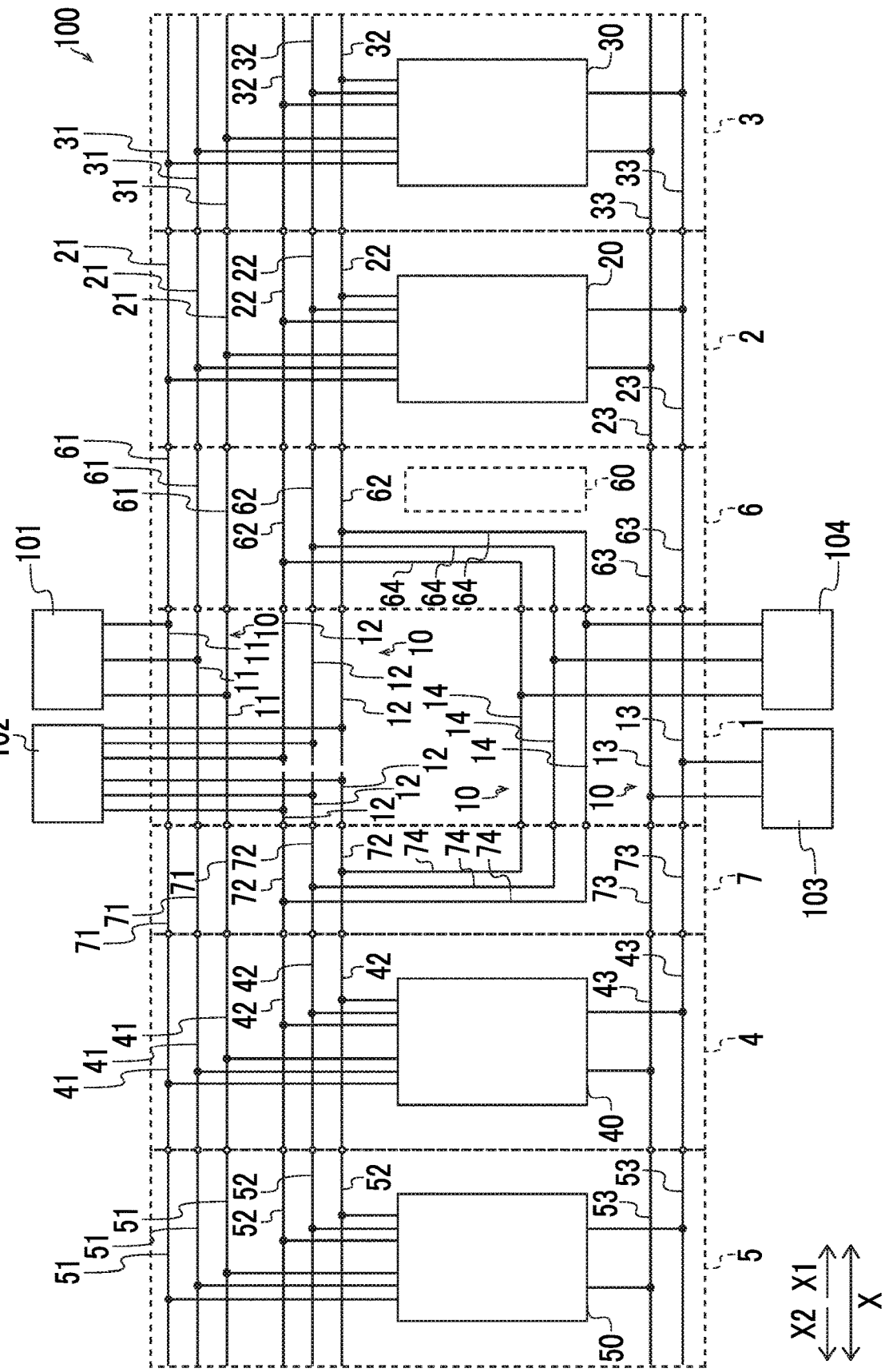
FIG. 2 is a schematic diagram for describing a configuration of the uninterruptible power supply device according to the first embodiment.

The uninterruptible power supply modules 2, 3, 4, and 5 include power conversion units 20, 30, 40, and 50, respectively, as shown in FIG. 2. The power conversion units 20, 30, 40, and 50 are configured to convert electric power received from an AC power supply 101 (see FIG. 2) outside the device via a plurality of AC input wires 11, and output the converted electric power to a load 102 (see FIG. 2) outside the device. The power conversion units 20 and 30 are examples of a "one-sided power conversion unit" in the claims. Further, the power conversion units 40 and 50 are examples of an "other-sided power conversion unit" in the claims. A plurality of loads 102 may be provided for the uninterruptible power supply device 100.

The power conversion units 20, 30, 40, and 50 are configured to convert the electric power received from the AC power supply 101 outside the device. The power conversion units 20, 30, 40, and 50 each include a rectifier circuit, an inverter circuit, and a chopper circuit. The rectifier circuit has a function of converting AC power input to each of the power conversion units 20, 30, 40, and 50 into DC power. The chopper circuit is configured as, for example, a three-level chopper circuit. The chopper circuit has a function of transforming and outputting a voltage input from a battery 103 outside the device. The DC power input from the battery 103 is input to the chopper circuit via a conductor, a capacitor, and a DC reactor (not shown). Further, the inverter circuit has a function of converting DC power input from the rectifier circuit and the chopper circuit into AC power.

As shown in FIG. 2, the bypass module 6 is provided with a plurality of bypass wires 64. In addition, as shown in FIG. 2, the bypass module 7 is provided with a plurality of bypass wires 74. The plurality of bypass wires 64 and 74 is provided to output electric power from a bypass power supply AC power supply 104 (see FIG. 2) outside the device to the load 102 (see FIG. 2) outside the device not via the power conversion unit (power conversion units 20, 30, 40, and 50) at the time of maintenance or the like. The plurality of bypass wires 64 and 74 is provided in correspondence with phases of the electric power supplied from the bypass power supply AC power supply 104. Three bypass wires 64 and three bypass wires 74 are provided in correspondence with phases (U phase, V phase, and W phase) of the electric power supplied from the bypass power supply AC power supply 104.

As shown in FIG. 2, the bypass module 6 includes a control unit 60. The control unit 60 includes a control board (circuit board) on which a central processing unit (CPU), a read only memory (ROM), a random access memory (RAM), and the like are attached. The control unit 60 is configured to control the power conversion of the entire uninterruptible power supply device 100 (power conversion units 20, 30, 40, and 50). That is, the bypass module 6 is a control module including a plurality of bypass wires 64 (bypass circuits).

Figure 3:
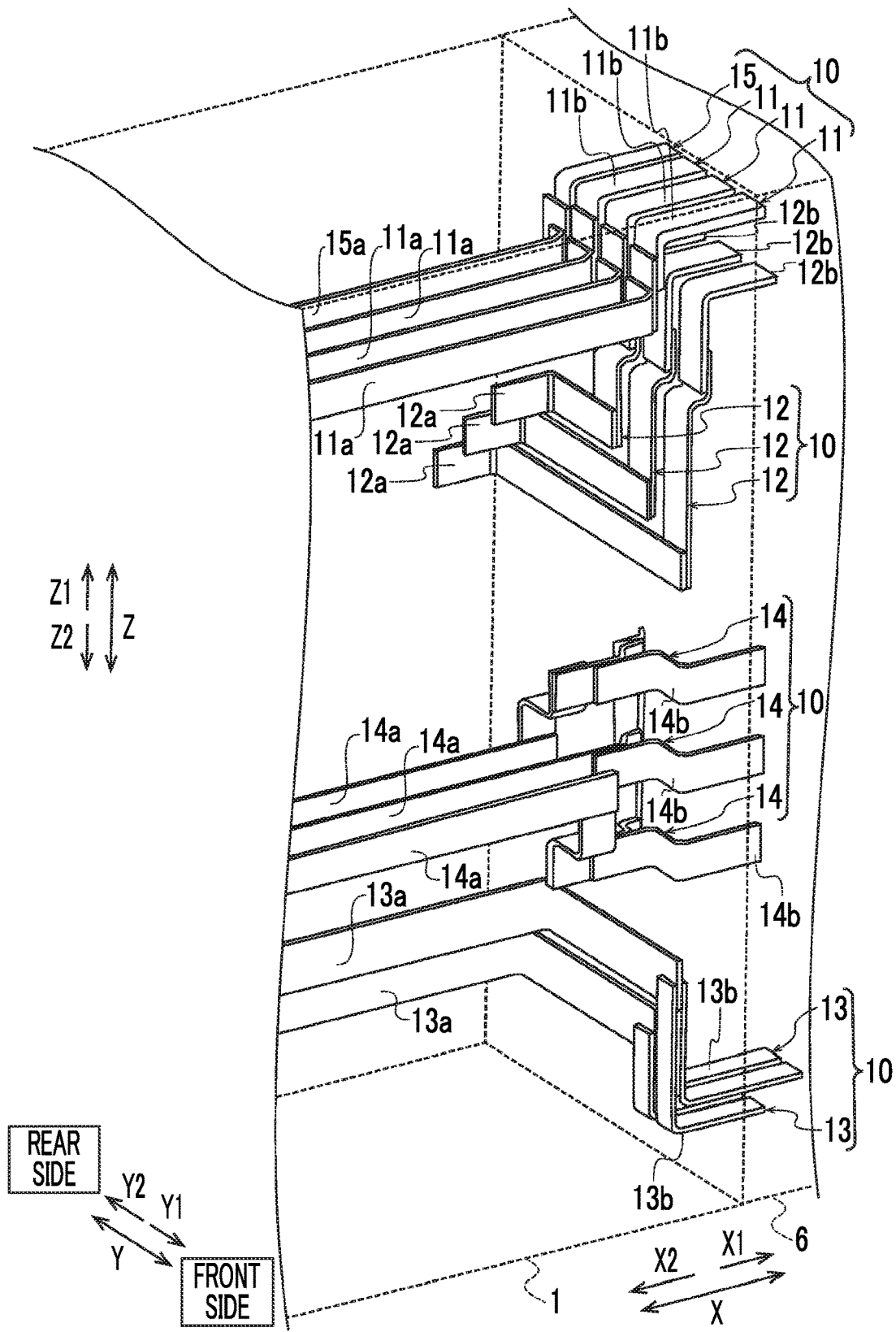
FIG. 3 is a first perspective view showing a configuration of a plurality of conductor wires having a plate shape inside an input module according to the first embodiment.
Figure 4:
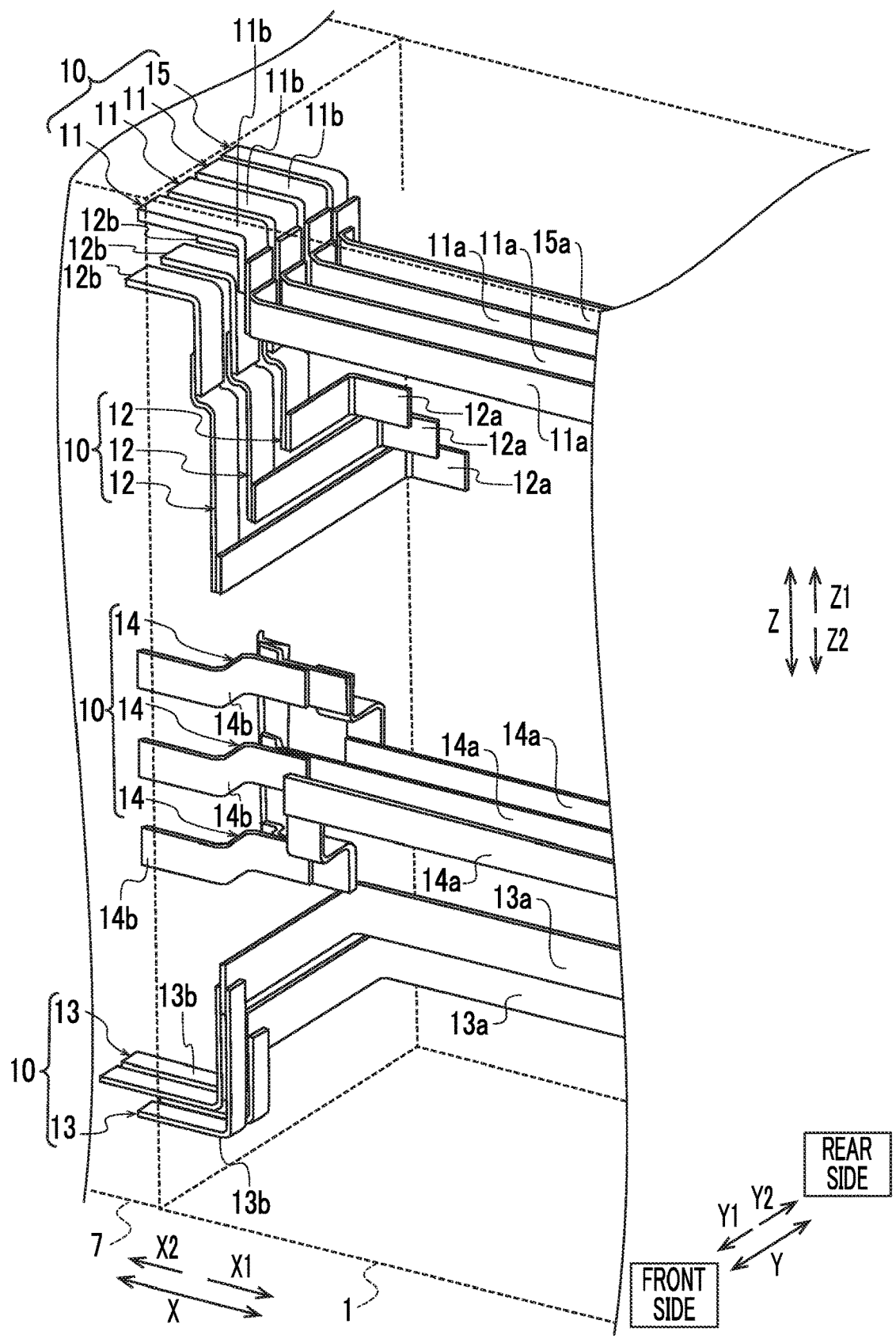
FIG. 4 is a second perspective view showing a configuration of the plurality of conductor wires having a plate shape inside the input module according to the first embodiment.

The input module 1 is provided with a plurality of conductor wires 10 having a plate shape (see FIGS. 3 and 4). The plurality of conductor wires 10 having a plate shape includes a metal plate such as a copper bar. In the first embodiment, the plurality of conductor wires 10 having a plate shape includes a plurality of AC input wires 11, a plurality of AC output wires 12, a plurality of DC input wires 13, and a plurality of bypass input wires 14.

As shown in FIG. 2, the plurality of AC input wires 11 is electrically connected to the power conversion unit 20 of the uninterruptible power supply module 2, the power conversion unit 30 of the uninterruptible power supply module 3, the power conversion unit 40 of the uninterruptible power supply module 4, and the power conversion unit 50 of the uninterruptible power supply module 5.

Three AC input wires 11 are provided in correspondence with the three phases (U phase, V phase, and W phase) of the electric power supplied from the AC power supply 101 outside the device.

Further, the AC output wires 12 provided on the uninterruptible power supply module 2 side (X1 direction side) are electrically connected to the power conversion units 20 and 30 of the uninterruptible power supply modules 2 and 3 (see FIG. 2). Then, the AC output wires 12 provided on the uninterruptible power supply module 4 side (X2 direction side) are electrically connected to the power conversion units 40 and 50 of the uninterruptible power supply modules 4 and 5 (see FIG. 2).

The AC output wires 12 provided on the uninterruptible power supply module 2 side (X1 direction side) are converted by the power conversion units 20 and 30, and three AC output wires are provided in correspondence with phases (U phase, V phase, and W phase) of the output electric power (see FIG. 3). Further, the AC output wires 12 provided on the uninterruptible power supply module 4 side (X2 direction side) are converted by the power conversion units 40 and 50, and three AC output wires are provided in correspondence with phases (U phase, V phase, and W phase) of the output electric power (see FIG. 4). That is, a total of six AC output wires 12 are provided, three on the side where the uninterruptible power supply module 2 of the input module 1 is disposed (X1 direction side), and three on the side where the uninterruptible power supply module 4 of the input module 1 is disposed (X2 direction side).

Further, as shown in FIG. 2, the plurality of DC input wires 13 is electrically connected to the power conversion unit 20 of the uninterruptible power supply module 2, the power conversion unit 30 of the uninterruptible power supply module 3, the power conversion unit 40 of the uninterruptible power supply module 4, and the power conversion unit 50 of the uninterruptible power supply module 5.

Two DC input wires 13 are provided in correspondence with phases (P phase and N phase) of the electric power supplied from the battery 103 outside the device.

In addition, as shown in FIG. 2, the plurality of bypass input wires 14 is electrically connected to the plurality of bypass wires 64 of the bypass module 6 and the plurality of bypass wires 74 of the bypass module 7. The plurality of bypass wires 64 and 74 is examples of a "plurality of bypass wires" in the claims. Further, the plurality of bypass wires 64 is an example of a "plurality of one-sided bypass wires" in the claims. Further, the plurality of bypass wires 74 is an example of a "plurality of other-sided bypass wires" in the claims. The plurality of bypass wires 64 and 74 is wires including a metal plate such as a copper bar.

Three bypass input wires 14 are provided in correspondence with the bypass wires 64 (bypass wires 74). That is, three bypass input wires 14 are provided in correspondence with phases (U phase, V phase, and W phase) of the electric power supplied from the bypass power supply AC power supply 104.

Further, as shown in FIG. 2, the uninterruptible power supply module 2, the uninterruptible power supply module 3, the uninterruptible power supply module 4, the uninterruptible power supply module 5, the bypass module 6, and the bypass module 7 are provided with busbars 21, 31, 41, 51, 61, and 71, respectively, as busbars for AC input. The busbars 21, 31, 41, 51, 61, and 71 are wires including a metal plate such as a copper bar.

Three busbars 21, three busbars 31, three busbars 41, three busbars 51, three busbars 61, and three busbars 71 are provided in correspondence with the three phases (U phase, V phase, and W phase) of the electric power supplied from the AC power supply 101 outside the device. The busbars 21, 31, 41, and 51 are electrically connected to the power conversion units 20, 30, 40, and 50, respectively, via switches (not shown). Further, in the first embodiment, each busbar for AC input and the AC input wire 11 are connected in the order of the busbar 51, the busbar 41, the busbar 71, the AC input wire 11, the busbar 61, the busbar 21, and the busbar 31 from the X2 direction side.

Further, as shown in FIG. 2, the uninterruptible power supply module 2, the uninterruptible power supply module 3, the uninterruptible power supply module 4, the uninterruptible power supply module 5, the bypass module 6, and the bypass module 7 are provided with busbars 22, 32, 42, 52, 62, and 72, respectively, as busbars for AC output. The busbars 22, 32, 42, 52, 62, and 72 are wires including a metal plate such as a copper bar.

The busbars 22, 32, 42, 52, 62, and 72 are converted by the power conversion units 20, 30, 40, and 50, and three busbars 22, three busbars 32, three busbars 42, three busbars 52, three busbars 62, and three busbars 72 are provided in correspondence with phases (U phase, V phase, and W phase) of the output electric power. The busbars 22, 32, 42, and 52 are electrically connected to the power conversion units 20, 30, 40, and 50, respectively, via switches (not shown).

In the first embodiment, on the X2 direction side of the input module 1, respective busbars for AC output and the AC output wire 12 are connected in the order of the busbar 52, the busbar 42, the busbar 72, and the AC output wire 12 from the X2 direction side. Further, on the X1 direction side of the input module 1, respective busbar for AC output and the AC output wire 12 are connected in the order of the AC output wire 12, the busbar 62, the busbar 22, and the busbar 32 from the X2 direction side.

Further, a plurality of bypass wires 64 and 74 is electrically connected to the busbars 62 and 72, respectively. The bypass wire 64 (bypass wire 74) is provided with a circuit breaker (not shown) on the busbar 61 (busbar 71) side and a reactor (not shown) on the bypass input wire 14 side.

Further, as shown in FIG. 2, the uninterruptible power supply module 2, the uninterruptible power supply module 3, the uninterruptible power supply module 4, the uninterruptible power supply module 5, the bypass module 6, and the bypass module 7 are provided with busbars 23, 33, 43, 53, 63, and 73, respectively, as busbars for DC input. The busbars 23, 33, 43, 53, 63, and 73 are wires including a metal plate such as a copper bar.

Further, two busbars 23, two busbars 33, two busbars 43, two busbars 53, two busbars 63, and two busbars 73 are provided in correspondence with phases (P phase and N phase) of the electric power supplied from the battery 103 outside the device. The busbars 23, 33, 43, and 53 are electrically connected to the power conversion units 20, 30, 40, and 50, respectively, via switches (not shown).

In the first embodiment, respective busbars for DC input and the DC input wire 13 are connected in the order of the busbar 53, the busbar 43, the busbar 73, the DC input wire 13, the busbar 63, the busbar 23, and the busbar 33 from the X2 direction side.

As shown in FIGS. 3 and 4, the input module 1 is provided with the plurality of conductor wires 10 having a plate shape constituting the plurality of AC input wires 11 provided at least in correspondence with phases of the electric power supplied from the AC power supply 101 outside the device.

The plurality of AC input wires 11 each has AC input cable attachment portions 11a (see FIGS. 3 and 4). As shown in FIGS. 3 and 4, the AC input cable attachment portions 11a are formed so as to extend in the X direction, and AC input cables 101a (see FIGS. 5 and 6) electrically connected to the AC power supply 101 outside the device are attached thereto. The X direction is a direction in which the uninterruptible power supply modules 2, 3, 4, and 5 (the plurality of uninterruptible power supply modules) and the input module 1 are adjacent to each other, and is an example of a "first direction" in the claims.

Further, as shown in FIGS. 3 and 4, the AC input cable attachment portions 11a are disposed so as to be separated from each other in a Y direction, which is a direction in which a front side (Y1 direction side) and a rear side (Y2 direction side) of the input module 1 face each other. The Y direction is an example of a "second direction" in the claims.

Further, the plurality of AC input wires 11 have busbar connection portions 11b (see FIGS. 3 and 4) for connecting the busbars (busbars 61 or busbars 71) for AC input of adjacent modules (bypass module 6 or 7) at the ends in the X direction (X2 direction side and X1 direction side).

As described above, the plurality of AC input wires 11 is electrically connected to the power conversion units 20, 30, 40, and 50. In the uninterruptible power supply device 100, the electric power from the AC power supply 101 outside the device is configured to be input to each of the power conversion units 20, 30, 40, and 50 via the AC input cable attachment portion 11a extending from the one side (X1 direction side) of each of the plurality of AC input wires 11 to the other side (X2 direction side).

The plurality of conductor wires 10 having a plate shape further includes (constitutes) the plurality of AC output wires 12 (see FIGS. 3 and 4) that is converted by the power conversion units 20, 30, 40, and 50 and corresponds to phases of the output electric power. The plurality of AC output wires 12 has output cable attachment portions 12a as shown in FIGS. 3 and 4.

As shown in FIGS. 3 and 4, the output cable attachment portions 12a are formed so as to extend in the X direction (first direction), and output cables 102a (see FIGS. 5 and 6) electrically connected to the load 102 outside the device are attached thereto.

Further, as shown in FIGS. 3 and 4, the output cable attachment portions 12a of the plurality of AC output wires 12 are disposed so as to be separated from each other in the Y direction (second direction).

Further, as shown in FIG. 3, the plurality of AC output wires 12 on the X1 direction side (one side) has busbar connection portions 12b for connecting the busbars (busbars 62) for AC output of adjacent modules (bypass module 6) at the end in the X1 direction.

Further, as shown in FIG. 4, the plurality of AC output wires 12 on the X2 direction side (the other side) has busbar connection portions 12b for connecting the busbars (busbars 72) for AC output of adjacent modules (bypass module 7) at the end in the X2 direction.

As described above, the AC output wires 12 (see FIG. 3) provided on the X1 direction side are electrically connected to the power conversion units 20 and 30 of the uninterruptible power supply modules 2 and 3. Further, the AC output wires 12 (see FIG. 4) provided on the X2 direction side are electrically connected to the power conversion units 40 and 50 of the uninterruptible power supply modules 4 and 5. In the uninterruptible power supply device 100, the electric power converted by each of the power conversion units 20, 30, 40, and 50 is configured to be output to the load 102 outside the device via the output cable attachment portion 12a of each of the plurality of AC output wires 12.

Further, the plurality of conductor wires 10 having a plate shape includes (constitutes) the plurality of DC input wires 13 (see FIGS. 3 and 4) corresponding to phases of the electric power supplied from the battery 103 outside the device. The plurality of DC input wires 13 has DC input cable attachment portions 13a as shown in FIGS. 3 and 4.

As shown in FIGS. 3 and 4, the DC input cable attachment portions 13a are formed so as to extend in the X direction (first direction), and DC input cables 103a (see FIGS. 5 and 6) electrically connected to the battery 103 outside the device are attached thereto.

Further, as shown in FIGS. 3 and 4, the DC input cable attachment portions 13a are disposed so as to be separated from each other in the Y direction (second direction).

Further, the plurality of DC input wires 13 has busbar connection portions 13b (see FIGS. 3 and 4) for connecting the busbars (busbars 63 or busbars 73) for DC input of adjacent modules (bypass module 6 or 7) at the ends in the X direction (X2 direction side and X1 direction side).

As described above, the plurality of DC input wires 13 is electrically connected to the power conversion units 20, 30, 40, and 50. In the uninterruptible power supply device 100, the electric power from the battery 103 outside the device is configured to be input to each of the power conversion units 20, 30, 40, and 50 via the DC input cable attachment portion 13a extending from the one side (X1 direction side) of each of the plurality of DC input wires 13 to the other side (X2 direction side).

The plurality of conductor wires 10 having a plate shape includes (constitutes) the plurality of bypass input wires 14 (see FIGS. 3 and 4) corresponding to the plurality of bypass wires 64 (the plurality of bypass wires 74). The plurality of bypass input wires 14 has bypass input cable attachment portions 14a as shown in FIGS. 3 and 4.

As shown in FIGS. 3 and 4, the bypass input cable attachment portions 14a are formed so as to extend in the X direction (first direction), and bypass input cables 104a (see FIGS. 5 and 6) electrically connected to the bypass power supply AC power supply 104 outside the device are attached thereto.

Further, as shown in FIGS. 3 and 4, the bypass input cable attachment portions 14a are disposed so as to be separated from each other in the Y direction (second direction).

Further, the plurality of bypass input wires 14 has bypass wire connection portions 14b (see FIGS. 3 and 4) for connecting the bypass wires (bypass wires 64 or bypass wires 74) of adjacent bypass modules (bypass module 6 or 7) at the ends in the X direction (X2 direction side and X1 direction side).

As described above, the plurality of bypass input wires 14 is electrically connected to the power conversion units 20, 30, 40, and 50. In the uninterruptible power supply device 100, the electric power from the bypass power supply AC power supply 104 outside the device is configured to be input to each of the plurality of bypass wires 64 and the plurality of bypass wires 74 via the bypass input cable attachment portion 14a extending from one side (X1 direction side) of each of the plurality of bypass input wires 14 to the other side (X2 direction side).

Further, the plurality of conductor wires 10 having a plate shape includes (constitutes) a wire 15 for a neutral wire (N phase) (see FIGS. 3 and 4). The wire 15 for a neutral wire has a cable attachment portion 15a for a neutral wire (N phase) as shown in FIGS. 3 and 4. The uninterruptible power supply device 100 receives AC power from the AC power supply 101 outside the device by a total of four wires including three AC input wires 11 (three wires) corresponding to three phases (U phase, V phase, and W phase) of electric power supplied (input) from the AC power supply 101 outside the device, and one wire 15 for a neutral wire (N phase) (one wire). That is, the uninterruptible power supply device 100 uses a three-phase four-wire system as a method for receiving AC power from the AC power supply 101. The wire 15 for a neutral wire is electrically connected to a wire for a neutral wire (N phase) (not shown) provided in the uninterruptible power supply modules 2 to 5 and the bypass modules 6 and 7.

As shown in FIGS. 3 and 4, the cable attachment portion 15a for a neutral wire is formed along the AC input cable attachment portion 11a, and cables 105a for neutral wires (see FIGS. 5 and 6) electrically connected to the bypass power supply AC power supply 104 outside the device are attached thereto.

Figure 5:
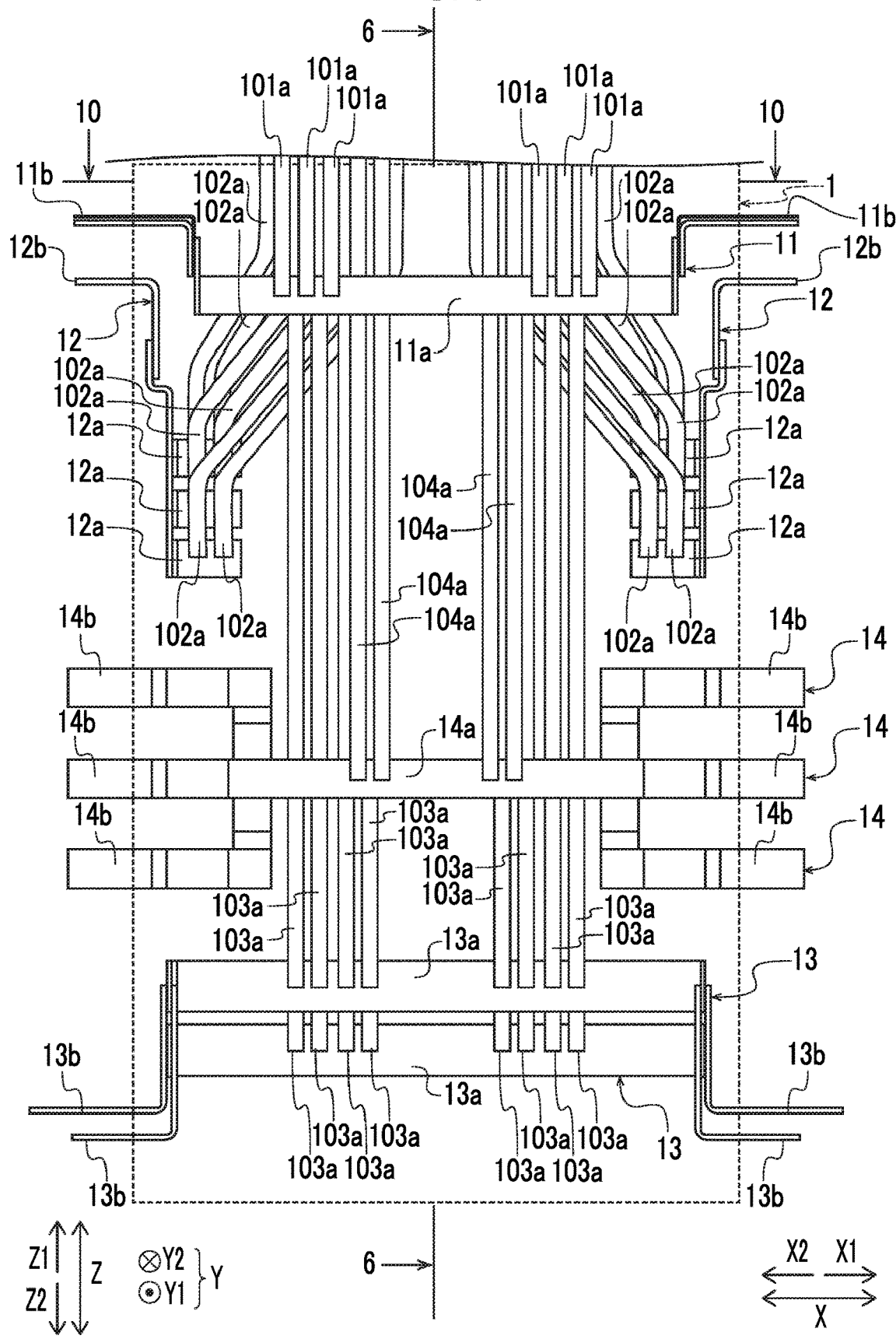
FIG. 5 is a front view showing attachment of a cable inside the input module according to the first embodiment.
Figure 6:
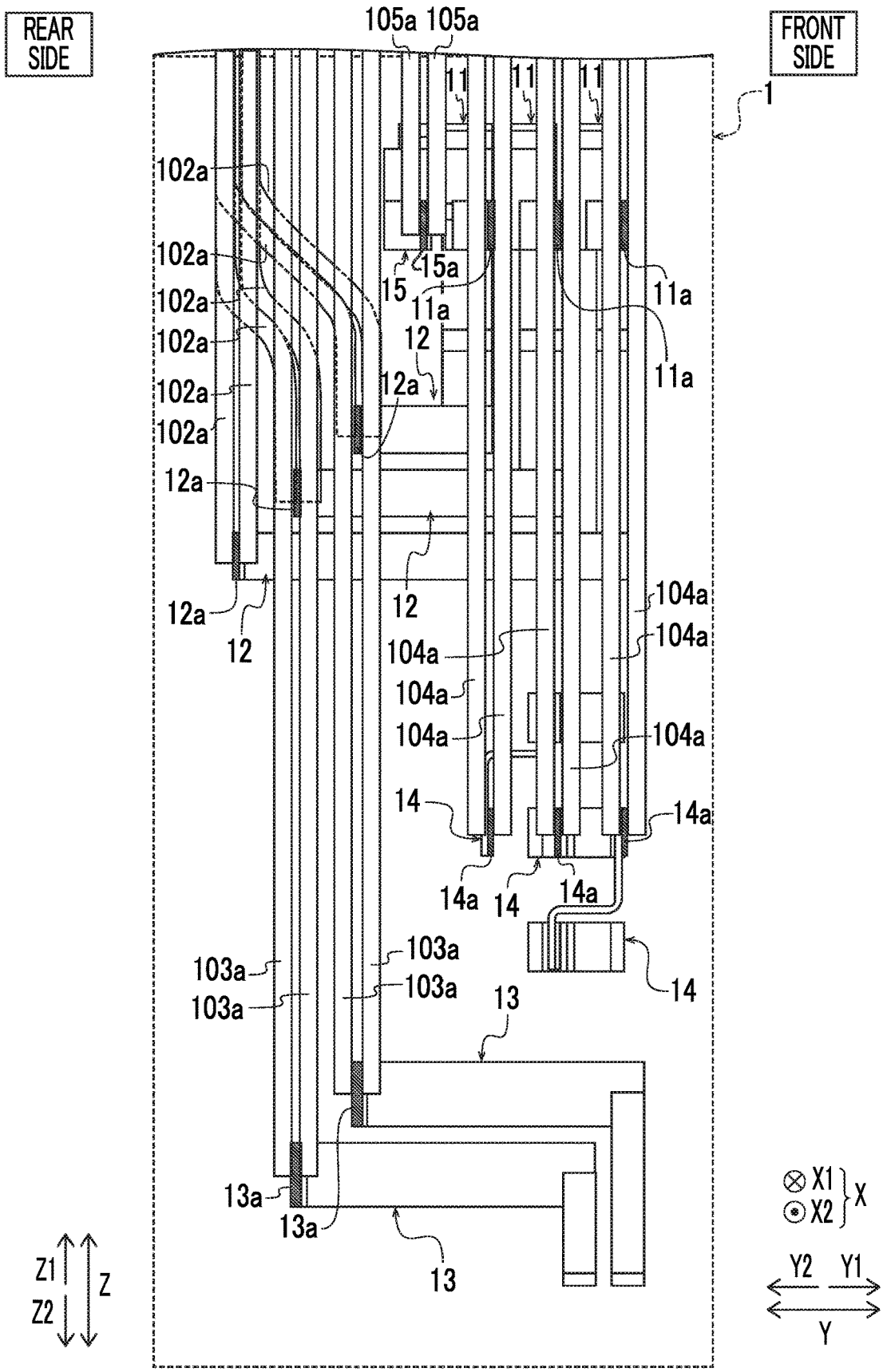
FIG. 6 is a cross-sectional view taken along line 6-6 of FIG. 5.
Figure 7:
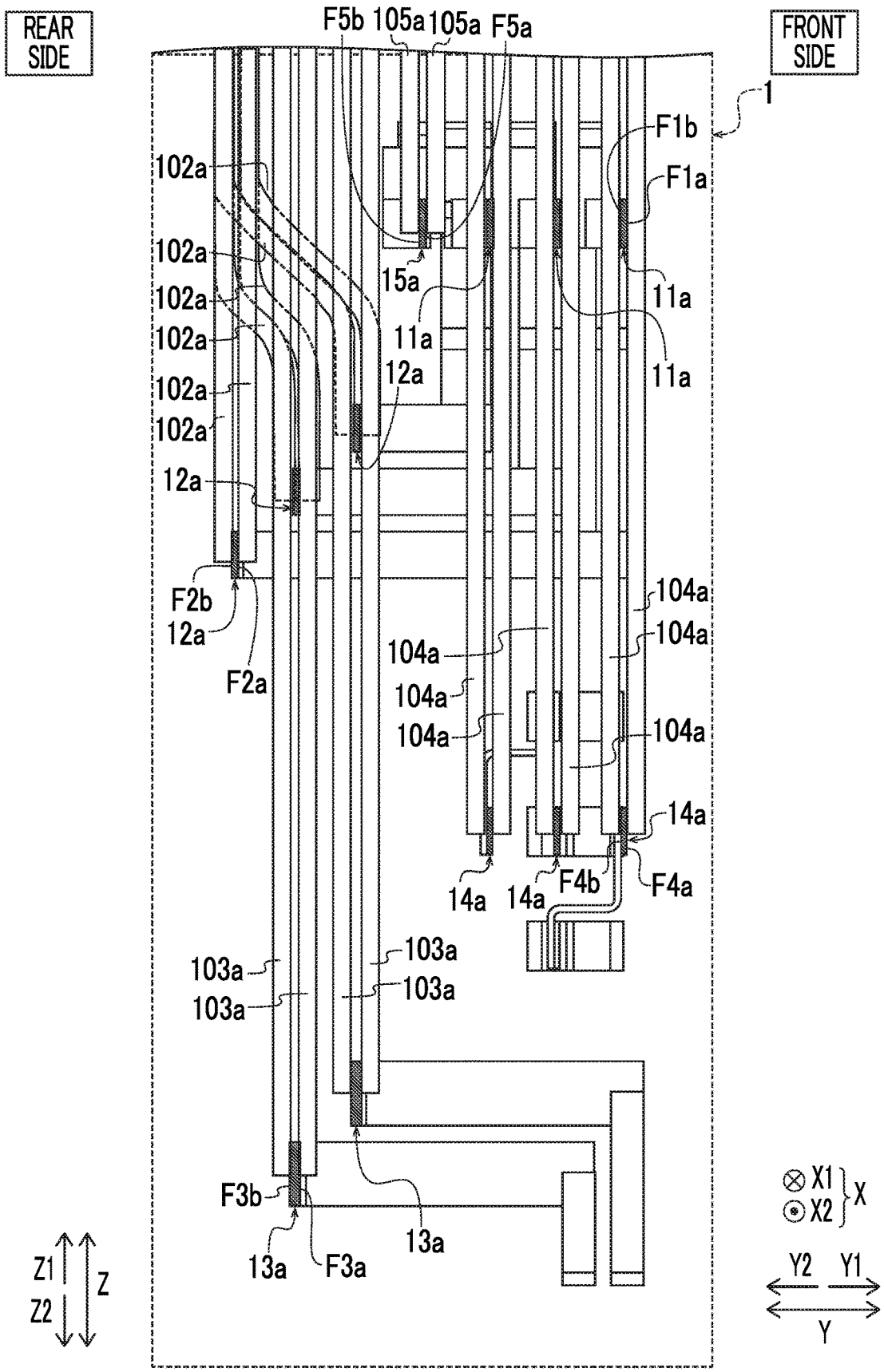
FIG. 7 is a cross-sectional view for describing a configuration of an AC input cable attachment portion, an output cable attachment portion, a DC input cable attachment portion, and a bypass input cable attachment portion.

In the first embodiment, as shown in FIGS. 5 to 7, the AC input cables 101a, the output cables 102a, the DC input cables 103a, the bypass input cables 104a, and the cables 105a for neutral wires extend from the upper side (Z1 direction side) to the lower side (Z2 direction side). Further, as shown in FIGS. 5 to 7, the main surfaces (the surface having the largest area) of each of the AC input cable attachment portions 11a, the output cable attachment portions 12a, the DC input cable attachment portions 13a, the bypass input cable attachment portions 14a, and the cable attachment portion 15a for a neutral wire are disposed (formed) so as to be along the vertical direction (Z direction).

Specifically, as shown in FIG. 7, on the Y1 direction side (front side) of the AC input cable attachment portions 11a, the output cable attachment portions 12a, the DC input cable attachment portions 13a, the bypass input cable attachment portions 14a, and the cable attachment portion 15a for a neutral wire, main surfaces F1a, F2a, F3a, F4a, and F5a are formed along the vertical direction (Z direction), respectively. Further, on the Y2 direction side (rear side) of the AC input cable attachment portions 11a, the output cable attachment portions 12a, the DC input cable attachment portions 13a, the bypass input cable attachment portions 14a, and the cable attachment portion 15a for a neutral wire, main surfaces F1b, F2b, F3b, F4b, and F5b are formed along the vertical direction (Z direction), respectively.

The AC input cable attachment portions 11a, the output cable attachment portions 12a, the DC input cable attachment portions 13a, the bypass input cable attachment portions 14a, and the cable attachment portion 15a for a neutral wire are connected to the corresponding cables (AC input cable attachment portions 11a, the output cable attachment portions 12a, the DC input cable attachment portions 13a, the bypass input cable attachment portions 14a, or the cables 105a for neutral wires) by fastening members such as bolts on the main surfaces (main surfaces F1a, F2a, F3a, F4a, and F5a) on Y1 direction side and the main surfaces (main surfaces F1b, F2b, F3b, F4b, and F5b) on the Y2 direction side.

Figure 8:
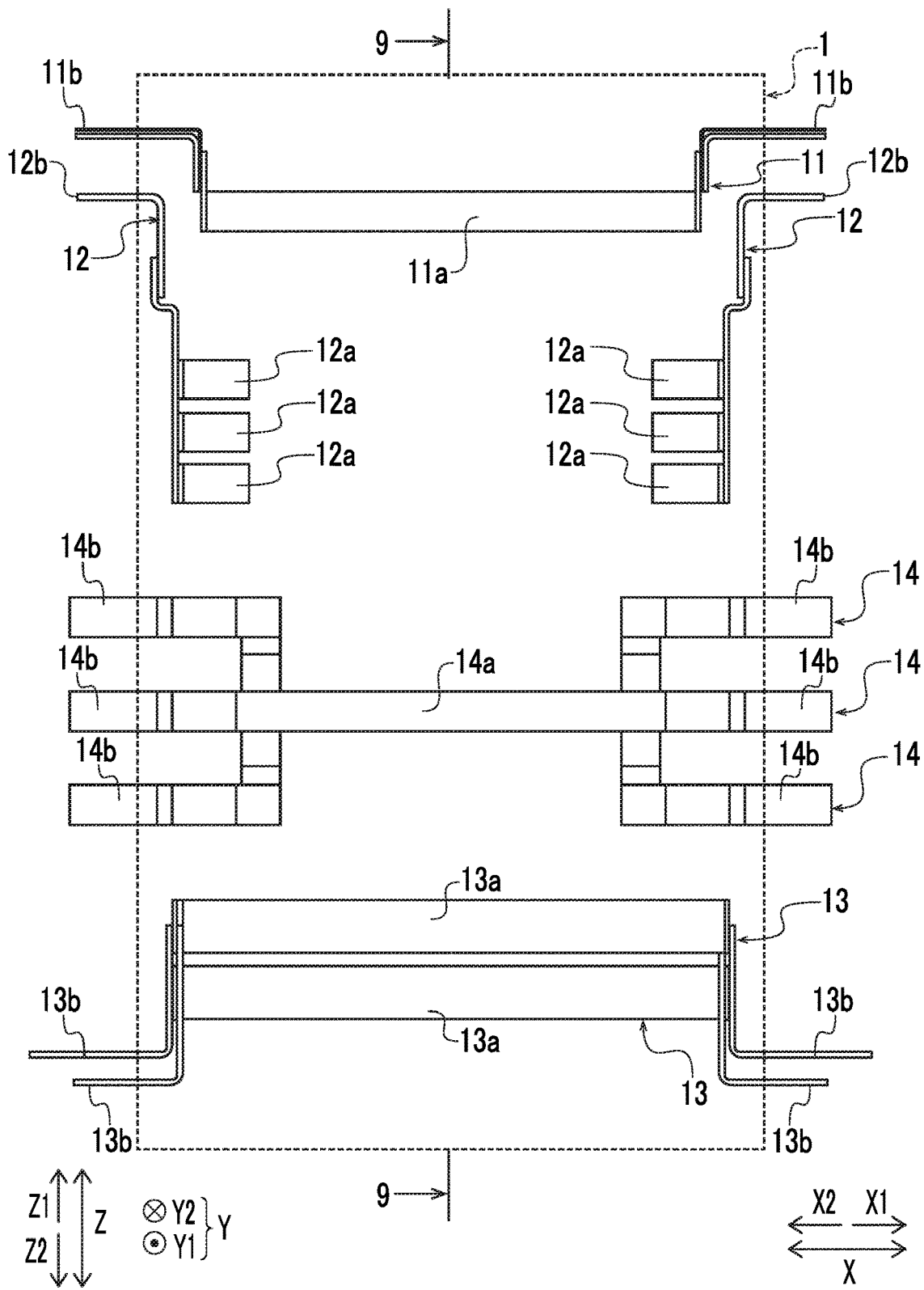
FIG. 8 is a front view showing a configuration of the plurality of conductor wires having a plate shape inside the input module according to the first embodiment.

As shown in FIG. 8, the AC input wire 11, the plurality of DC input wires 13, and the bypass input wires 14 (AC input cable attachment portion 11a, the DC input cable attachment portions 13a, and the bypass input cable attachment portion 14a) are formed so as to extend from the X1 direction side (bypass module 6 side) to the X2 direction side (bypass module 7 side). Further, the AC input wire 11, the DC input wires 13, and the bypass input wires 14 are formed so as to be line-symmetrical (left-right symmetric) with respect to an axis (central axis of the input module 1) along the Z direction (vertical direction). Further, the plurality of AC output wires 12 is formed so that the AC output wire 12 provided on the X2 direction side and the AC output wire 12 provided on the X1 direction side are inverted (left-right inverted) in the X direction.

Figure 9:
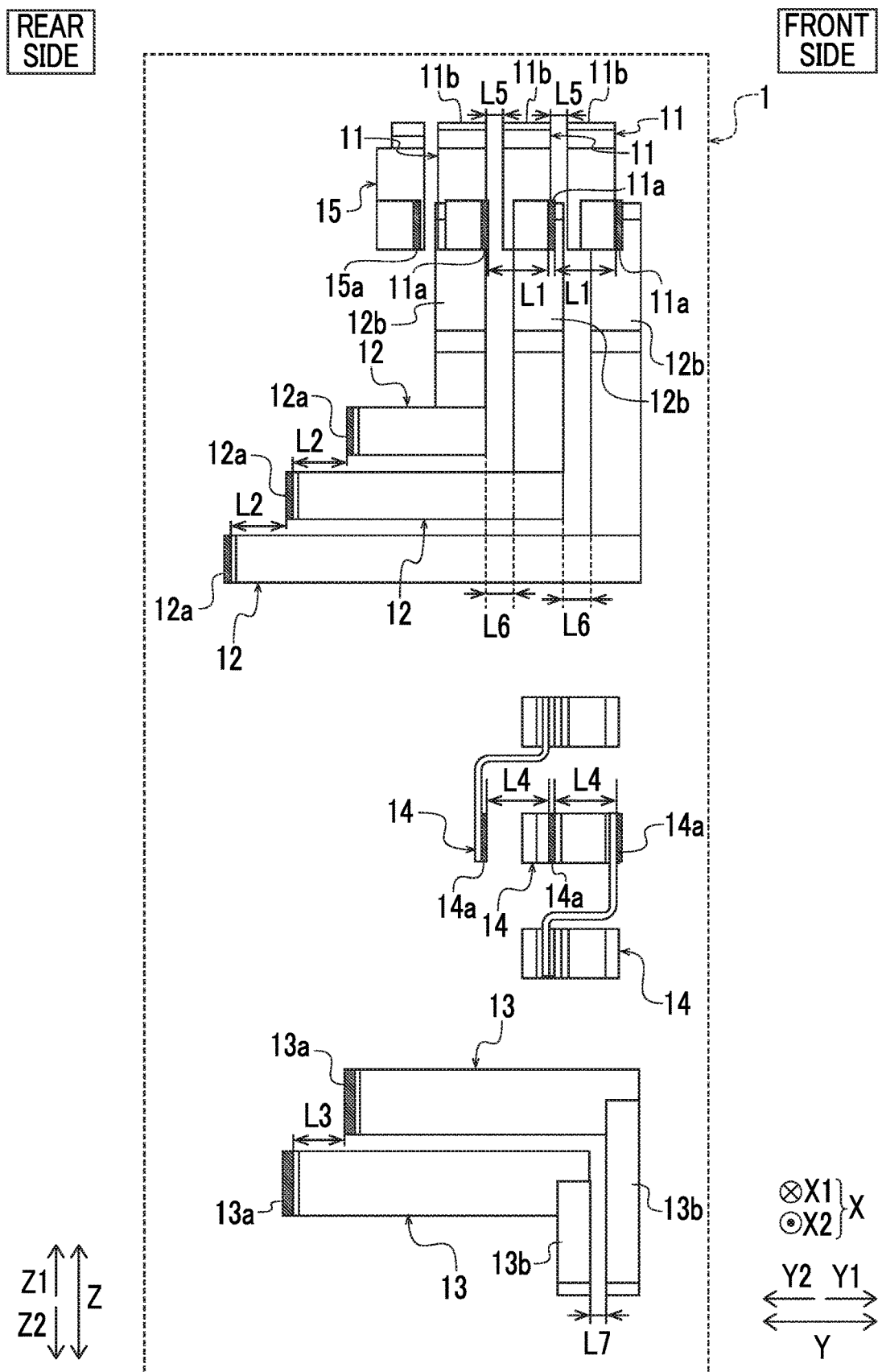
FIG. 9 is a cross-sectional view taken along line 9-9 of FIG. 8.
Figure 10:
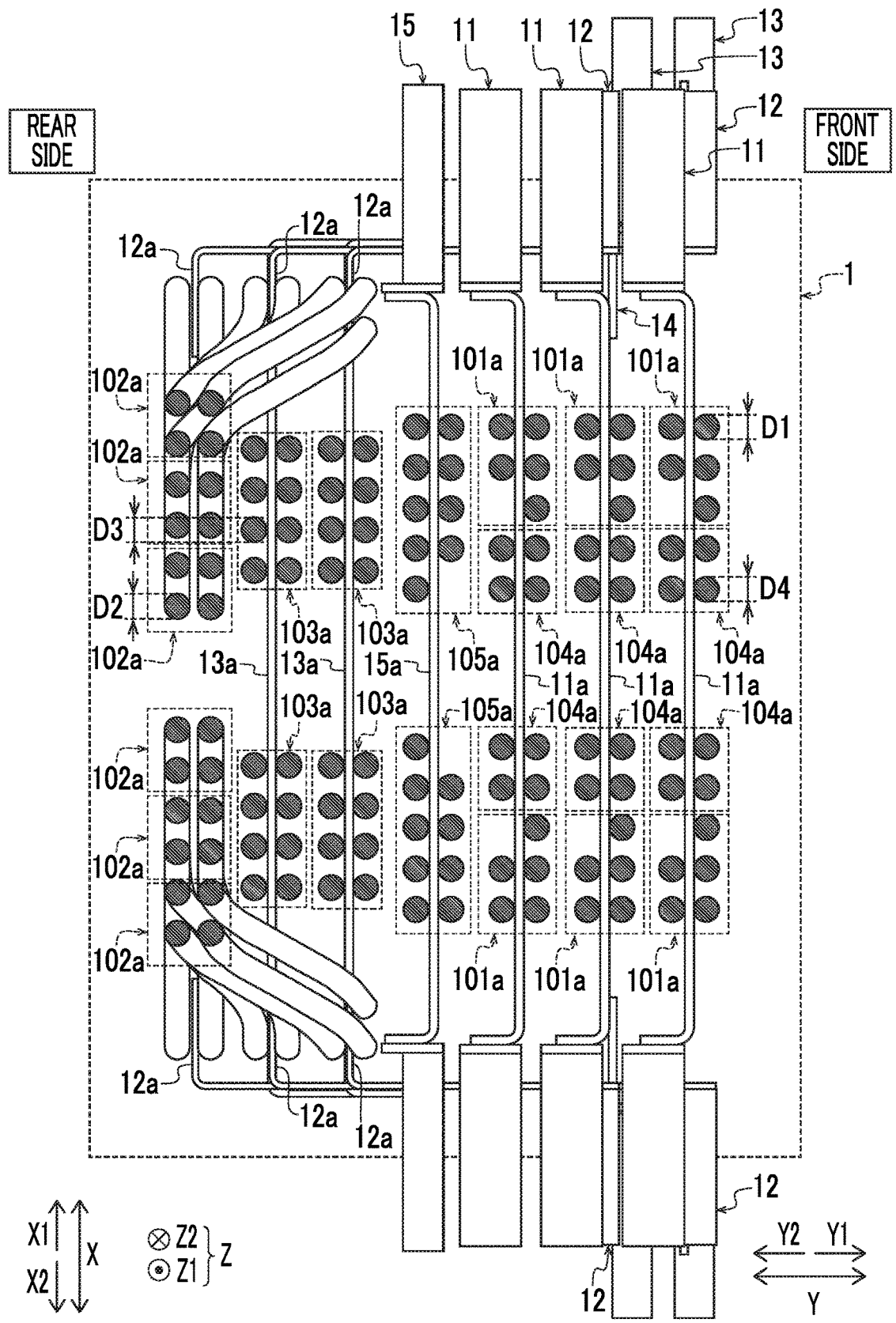
FIG. 10 is a cross-sectional view taken along line 10-10 of FIG. 5.

Further, as shown in FIGS. 8 and 9, inside the input module 1, the AC input cable attachment portions 11a, the output cable attachment portions 12a, the bypass input cable attachment portions 14a, and the DC input cable attachment portions 13a are disposed in this order from above (Z1 direction side).

Further, as shown in FIGS. 8 and 9, the AC input cable attachment portions 11a of the plurality of AC input wires 11 are disposed so as to overlap each other when viewed in the Y direction (second direction).

Further, as shown in FIGS. 8 and 9, the bypass input cable attachment portions 14a of the plurality of bypass input wires 14 are disposed so as to overlap each other when viewed in the Y direction (second direction).

As shown in FIGS. 8 and 9, the DC input cable attachment portions 13a of the plurality of DC input wires 13 are disposed so as to be offset in the Z direction (vertical direction). The Z direction is an example of a "vertical direction" in the claims.

As shown in FIGS. 8 and 9, the AC input cable attachment portion 11a of each of the plurality of AC input wires 11 is disposed so as to be offset in the Z direction (vertical direction) with respect to the DC input cable attachment portion 13a of each of the plurality of DC input wires 13.

As shown in FIG. 9, the output cable attachment portion 12a of each of the plurality of AC output wires 12 is disposed so as to be offset in the Y direction (second direction) with respect to the AC input cable attachment portion 11a of each of the plurality of AC input wires 11 and the bypass input cable attachment portion 14a of each of the plurality of bypass input wires 14.

Further, as shown in FIG. 9, the bypass input cable attachment portion 14a of each of the plurality of bypass input wires 14 is disposed so as to be offset in the Y direction (second direction) with respect to the DC input cable attachment portion 13a of each of the plurality of DC input wires 13.

Further, as shown in FIG. 9, the DC input cable attachment portion 13a of each of the plurality of DC input wires 13 is disposed so as to be offset in the Y direction (second direction) with respect to the AC input cable attachment portion 11a of each of the plurality of AC input wires 11.

Specifically, the output cable attachment portion 12a and the DC input cable attachment portion 13a are disposed on the rear side (Y2 direction side) of the input module 1 with respect to the AC input cable attachment portion 11a and the bypass input cable attachment portion 14a.

Further, the AC input cable attachment portions 11a of the plurality of AC input wires 11 are disposed so as to be separated from each other by a distance L1 (see FIG. 9). Further, the output cable attachment portions 12a of the plurality of AC output wires 12 are disposed so as to be separated from each other by a distance L2 (see FIG. 9). Further, the DC input cable attachment portions 13a are disposed so as to be separated from each other by a distance L3 (see FIG. 9). Further, the bypass input cable attachment portions 14a are disposed so as to be separated from each other by a distance L4 (see FIG. 9).

The distance L1 is longer than the aerial insulation distance at which the AC input cable attachment portions 11a do not cause a short circuit. Further, the distance L1 is longer than a diameter D1 of the AC input cable 101a (see FIG. 10) and longer than a distance L5 (see FIG. 8) between the busbar connection portions 11b in the Y direction.

The distance L2 is longer than the aerial insulation distance at which the output cable attachment portions 12a do not cause a short circuit. Further, the distance L2 is longer than a diameter D2 of the output cable 102a (see FIG. 10) and longer than a distance L6 (see FIG. 9) between the busbar connection portions 12b in the Y direction.

The distance L3 is a distance longer than the aerial insulation distance at which the DC input cable attachment portions 13a do not cause a short circuit. Further, the distance L3 is longer than a diameter D3 of the DC input cable 103a (see FIG. 10) and longer than a distance L7 (see FIG. 9) between the busbar connection portions 13b in the Y direction.

The distance L4 is a distance longer than the aerial insulation distance at which the bypass input cable attachment portions 14a do not cause a short circuit. Further, the distance L4 is longer than a diameter D4 (see FIG. 10) of the bypass input cable 104a.

Figure 11:
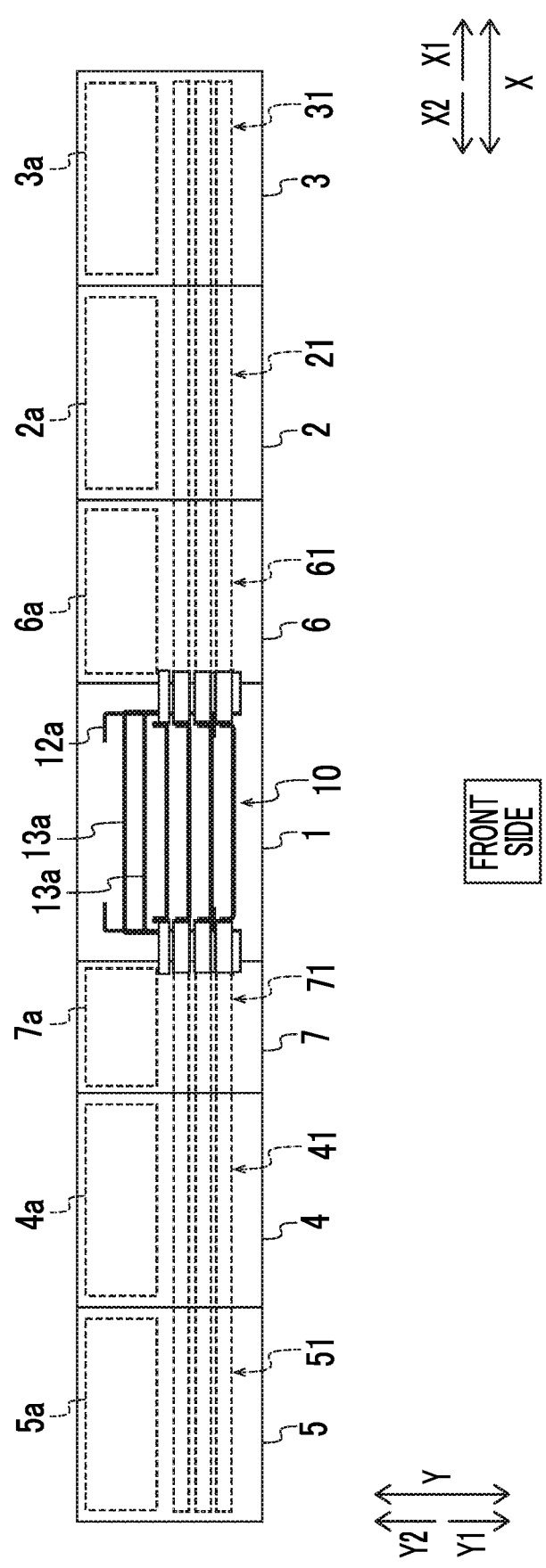
FIG. 11 is a diagram for describing the disposition of an output cable attachment portion and a DC input cable attachment portion when the inside of the input module according to the first embodiment of the present invention is viewed in above.

As shown in FIG. 11, the busbars 21, 31, 41, and 51 of the uninterruptible power supply modules 2, 3, 4, and 5 are provided on the front side (Y1 direction side) of each module. Further, the busbars 61 and 71 of the bypass modules 6 and 7 are provided on the front side (Y1 direction side) of each module. The other busbars (busbars 22, 23, 32, 33, 42, 43, 52, 53, 62, 63, 72 and 73) and the bypass wires 64 and 74 are also provided on the front side (Y1 direction side) of each module.

Further, as shown in FIG. 11, the uninterruptible power supply modules 2, 3, 4, and 5 are provided with duct portions 2a, 3a, 4a, and 5a as exhaust ducts on the rear side (Y2 direction side) of each module, respectively. Further, as shown in FIG. 11, the bypass modules 6 and 7 are provided with duct portions 6a and 7a as exhaust ducts on the rear side (Y2 direction side) of each module, respectively.

As described above, the output cable attachment portion 12a and the DC input cable attachment portion 13a are disposed on the rear side (Y2 direction side) of the input module 1 with respect to the AC input cable attachment portion 11a and the bypass input cable attachment portion 14a. The output cable attachment portion 12a and the DC input cable attachment portion 13a are disposed at positions corresponding to the positions where the duct portions 2a, 3a, 4a, 5a, 6a, and 7a are provided in the Y direction.

Further, the plurality of AC output wires 12 is connected to the busbar 62 of the bypass module 6 or the busbar 72 of the bypass module 7 by the busbar connection portion 12b on the front side (Y1 direction side) of the input module 1. Therefore, the plurality of AC output wires 12 is extended from the front side (Y1 direction side) of the input module 1 to the rear side (Y2 direction side) of the input module 1 in order to connect the output cable attachment portion 12a to the output cable 102a on the rear side (Y2 direction side) of the input module 1 (see FIGS. 3 and 4).

Further, the plurality of DC input wires 13 is connected to the busbar 63 of the bypass module 6 or the busbar 73 of the bypass module 7 by the busbar connection portion 13b on the front side (Y1 direction side) of the input module 1. Therefore, the plurality of DC input wires 13 is extended from the front side (Y1 direction side) of the input module 1 to the rear side (Y2 direction side) of the input module 1 in order to connect the DC input cable attachment portion 13a to the DC input cable 103a on the rear side (Y2 direction side) of the input module 1.

Effects of First Embodiment

In the first embodiment, the following effects can be obtained.

The AC input cable attachment portions 11a need to be separated from each other by the aerial insulation distance in order to prevent a short circuit. However, in the first embodiment, the AC input cable attachment portions 11a are disposed so as to be separated from each other in the Y direction, which is a direction in which the front side (Y1 direction side) and the rear side (Y2 direction side) of the input module 1 face each other. Thereby, unlike the case where the AC input cable attachment portions 11a are separated from each other in the X direction in which the uninterruptible power supply modules 2 to 5 and the input module 1 are adjacent to each other, it is possible to suppress an increase in the width of the input module 1 in the X direction. As a result, it is possible to suppress an increase in the width of the entire uninterruptible power supply device 100 in the X direction.

Further, in the first embodiment, as described above, the plurality of DC input wires 13 each extends in the X direction and has the DC input cable attachment portions 13a to which the DC input cable 103a electrically connected to the battery 103 outside the device is attached. The DC input cable attachment portions 13a are disposed so as to be separated from each other in the Y direction. Thereby, unlike the case where the DC input cable attachment portions 13*a* are separated from each other in the X direction, it is possible to suppress an increase in the width of the input module 1 in the X direction. As a result, it is possible to suppress an increase in the width of the entire uninterruptible power supply device 100 in the X direction.

Further, in the first embodiment, as described above, the DC input cable attachment portion 13*a* of each of the plurality of DC input wires 13 is disposed so as to be offset in the second direction with respect to the AC input cable attachment portion 11*a* of each of the plurality of AC input wires 11. Thereby, since the DC input cable attachment portion 13*a* is disposed so as to be offset in the Y direction with respect to the AC input cable attachment portion 11*a*, the DC input cable 103*a* can be easily attached or detached. As a result, workability at the time of installation and maintenance of the device can be improved.

Further, in the first embodiment, as described above, the AC input cable attachment portion 11*a* of each of the plurality of AC input wires 11 is disposed so as to be offset in the vertical direction (Z direction) with respect to the DC input cable attachment portion 13*a* of each of the plurality of DC input wires 13. Thereby, the AC input cable attachment portion 11*a* of each of the plurality of AC input wires 11 and the DC input cable attachment portion 13*a* of each of the plurality of DC input wires 13 can be more easily accessed from the front side (Y1 direction side) of the input module 1. Therefore, the AC input cable 101*a* can be more easily attached or detached, and the DC input cable 103*a* can be more easily attached or detached. As a result, workability at the time of installation and maintenance of the device can be further improved. Further, since the AC input cable attachment portion 11*a* is disposed so as to be offset in the vertical direction with respect to the DC input cable attachment portion 13*a*, unlike the case where the AC input cable attachment portion 11*a* is disposed so as to be offset in the X direction with respect to the DC input cable attachment portion 13*a*, it is possible to suppress an increase in the width of the input module 1 in the X direction. As a result, it is possible to suppress an increase in the width of the entire uninterruptible power supply device 100 in the X direction.

Further, in the first embodiment, as described above, the plurality of bypass input wires 14 each extends in the X direction and has the bypass input cable attachment portions 14*a* to which the bypass input cable 104*a* electrically connected to the bypass power supply AC power supply 104 outside the device is attached. The bypass input cable attachment portions 14*a* are disposed so as to be separated from each other in the Y direction. Thereby, unlike the case where the bypass input cable attachment portions 14*a* are separated from each other in the X direction, it is possible to suppress an increase in the width of the input module 1 in the X direction. As a result, it is possible to suppress an increase in the width of the entire uninterruptible power supply device in the X direction.

Further, in the first embodiment, as described above, the bypass input cable attachment portion 14*a* of each of the plurality of bypass input wires 14 is disposed so as to be offset in the Y direction with respect to the DC input cable attachment portion 13*a* of each of the plurality of DC input wires 13. Thereby, since the bypass input cable attachment portion 14*a* is disposed so as to be offset in the Y direction with respect to the DC input cable attachment portion 13*a*, the bypass input cable 104*a* can be easily attached or detached. As a result, workability at the time of installation and maintenance of the device can be improved.

Further, in the first embodiment, as described above, the DC input cable attachment portions 13*a* of the plurality of DC input wires 13 are disposed so as to be offset in the vertical direction (Z direction). Thereby, each of the DC input cable attachment portions 13*a* can be easily accessed from the front side (Y1 direction side) of the input module 1. Therefore, the DC input cable 103*a* can be more easily attached or detached. As a result, workability at the time of installation and maintenance of the device can be further improved. Further, since the DC input cable attachment portions 13*a* of the plurality of DC input wires 13 are disposed so as to be offset in the vertical direction, unlike the case where the DC input cable attachment portions 13*a* are disposed so as to be offset in the X direction, it is possible to suppress an increase in the width of the input module 1 in the X direction. As a result, it is possible to suppress an increase in the width of the entire uninterruptible power supply device 100 in the X direction.

Further, in the first embodiment, as described above, the plurality of AC input wires 11 is electrically connected to the power conversion units (power conversion units 20, 30, 40, and 50) of the uninterruptible power supply modules 2, 3, 4, and 5, respectively. Then, the electric power from the AC power supply 101 outside the device is configured to be input to the power conversion units 20, 30, 40, and 50 via the AC input cable attachment portion 11*a* extending from the X1 direction side to the X2 direction side of each of the plurality of AC input wires 11. Thereby, by passing through the AC input cable attachment portion 11*a* extending from the X1 direction side to the X2 direction side of each of the plurality of AC input wires 11, electric power from the AC power supply 101 outside the device can be easily supplied (input) to any of the power conversion units (power conversion units 20, 30, 40, and 50) of the uninterruptible power supply modules 2 and 3 disposed on the X1 direction side (one side) of the input module 1 and the uninterruptible power supply modules 4 and 5 disposed on the X2 direction side (the other side). As a result, even when the uninterruptible power supply module is disposed on either the X1 direction side (one side) or the X2 direction side (the other side) of the input module 1, the electric power from the AC power supply 101 outside the device can be easily supplied (input) to the power conversion unit of the disposed uninterruptible power supply module. Further, the uninterruptible power supply modules 2 and 3 are disposed on the X1 direction side (one side) of the input module 1, and the uninterruptible power supply modules 4 and 5 are disposed on the X2 direction side (the other side) of the input module 1. Thereby, the electric power from AC power supply 101 outside the device can be divided into the busbars 21 and 31 for AC input on the X1 direction side (one side) and the busbars 31 and 51 for AC input on the X2 direction side (the other side) of the input module 1. As a result, as compared with the case where the uninterruptible power supply modules 2 to 5 are disposed only on the X1 direction side or the X2 direction side of the input module 1, it is possible to suppress an increase in size of the busbars (busbars 21, 31, 41, and 51) for AC input of the uninterruptible power supply modules 2 to 5.

Further, in the first embodiment, as described above, the plurality of DC input wires 13 is electrically connected to the power conversion units (power conversion units 20, 30, 40, and 50) of the uninterruptible power supply modules 2, 3, 4, and 5, respectively, and the electric power from the battery 103 outside the device is configured to be input to each of the power conversion units 20, 30, 40, and 50 via the DC input cable attachment portion 13*a* extending from the X1 direction side to the X2 direction side of each of the plurality of DC input wires 13. Thereby, by passing through the DC input cable attachment portion 13a extending from the X1 direction side to the X2 direction side of each of the plurality of DC input wires 13, electric power from the battery 103 outside the device can be easily supplied (input) to any of the power conversion units (power conversion units 20, 30, 40, and 50) of the uninterruptible power supply modules 2 and 3 disposed on the X1 direction side (one side) of the input module 1 and the uninterruptible power supply modules 4 and 5 disposed on the X2 direction side (the other side). As a result, even when the uninterruptible power supply module 2, 3, 4, or 5 is disposed on either the X1 direction side (one side) or the X2 direction side (the other side) of the input module 1, the electric power from the battery 103 outside the device can be easily supplied (input) to the power conversion unit (power conversion unit 20, 30, 40, or 50) of the disposed uninterruptible power supply module 2, 3, 4, or 5.

Further, in the first embodiment, as described above, the plurality of bypass input wires 14 is electrically connected to the plurality of bypass wires 64 of the bypass module 6 and the plurality of bypass wires 74 of the bypass module 7. Then, the electric power from the bypass power supply AC power supply 104 outside the device is configured to be input to each of the plurality of bypass wires 64 and the plurality of bypass wires 74 via the bypass input cable attachment portion 14a extending from the X1 direction side to the X2 direction side of each of the plurality of bypass input wires 14. Thereby, by passing through the bypass input cable attachment portion 14a extending from the X1 direction side to the X2 direction side of each of the plurality of bypass input wires 14, the electric power from the bypass power supply AC power supply 104 outside the device can be easily supplied (input) to any of the plurality of bypass wires (the plurality of bypass wires 64 and the plurality of bypass wires 74) of the bypass module 6 disposed on the X1 direction side (one side) of the input module 1 and the bypass module 7 disposed on the X2 direction side (the other side) of the input module 1. As a result, even when the bypass module 6 or 7 is disposed on either the X1 direction side (one side) or the X2 direction side (the other side) of the input module 1, the electric power from the bypass power supply AC power supply 104 outside the device can be easily supplied (input) to the disposed bypass module 6 or 7.

Further, in the first embodiment, as described above, the plurality of AC output wires 12 each extends in the X direction and has the output cable attachment portion 12a to which the output cable 102a electrically connected to the load 102 outside the device is attached. The output cable attachment portions 12a of the plurality of AC output wires 12 are disposed so as to be separated from each other in the Y direction. Thereby, as compared with the case where the output cable attachment portions 12a are separated from each other in the X direction, it is possible to suppress an increase in the width of the input module 1 in the X direction. As a result, it is possible to suppress an increase in the width of the entire uninterruptible power supply device in the X direction.

Further, in the first embodiment, as described above, the output cable attachment portion 12a of each of the plurality of AC output wires 12 is disposed so as to be offset in the Y direction with respect to the AC input cable attachment portion 11a of each of the plurality of AC input wires 11 and the bypass input cable attachment portion 14a of each of the plurality of bypass input wires 14. Thereby, since the output cable attachment portion 12a is disposed so as to be offset in the Y direction with respect to the AC input cable attachment portion 11a and the bypass input cable attachment portion 14a, the output cable 102a can be easily attached or detached. As a result, workability at the time of installation and maintenance of the device can be improved.

Second Embodiment

With reference to FIGS. 12 to 15, the overall configuration of an uninterruptible power supply device 200 according to a second embodiment of the present invention will be described. The same components as those in the first embodiment are designated by the same reference numerals, and the description thereof will be omitted.

Figure 12:
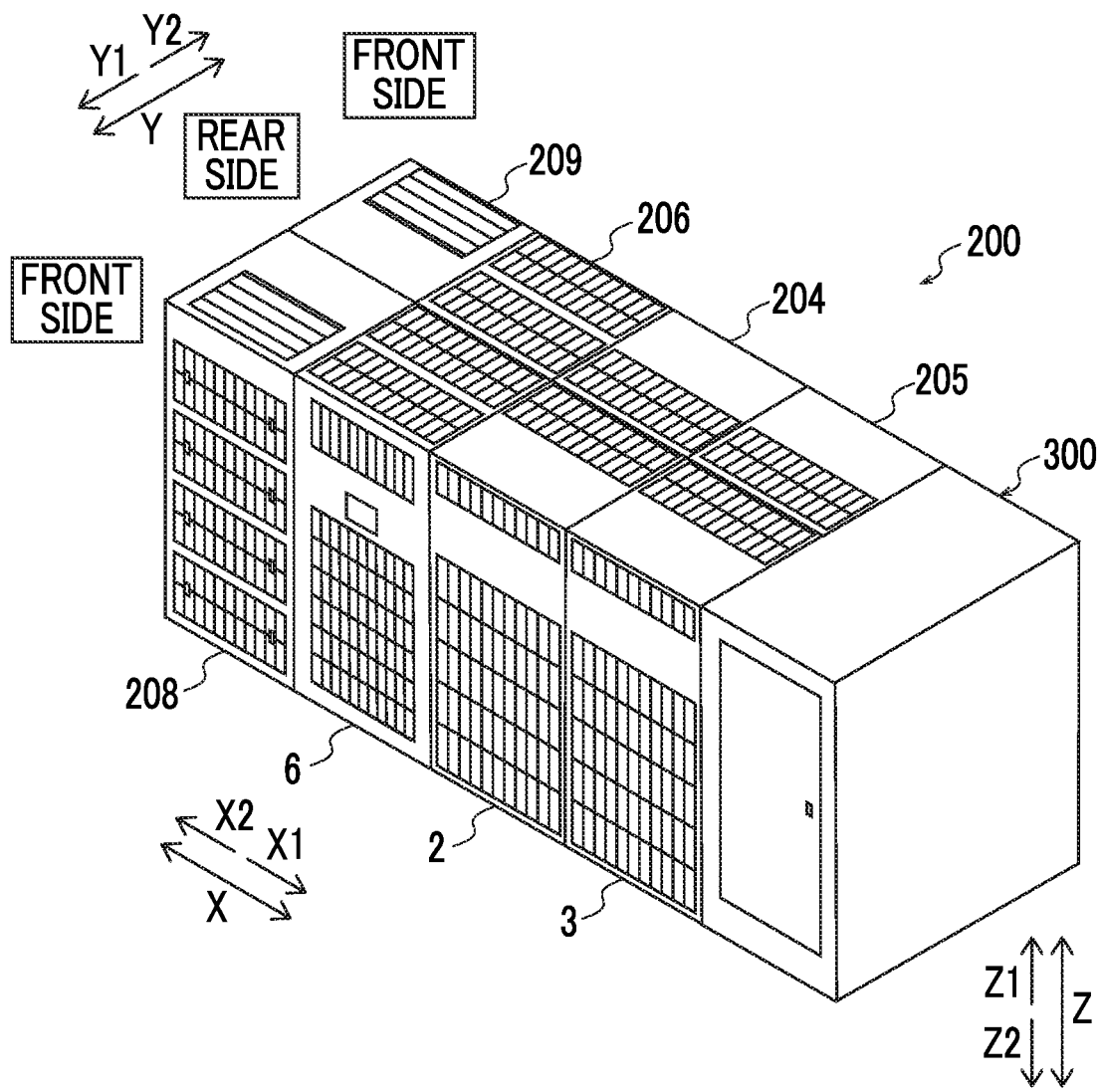
FIG. 12 is a perspective view showing an uninterruptible power supply device according to a second embodiment of the present invention.

The uninterruptible power supply device 200 according to the second embodiment includes uninterruptible power supply modules 2, 3, 204, and 205 as shown in FIG. 12. The uninterruptible power supply device 200 includes two input modules (input modules 208 and 209) and two bypass modules (bypass modules 6 and 206). In addition, an output branch board 300 is provided on the X1 direction side (one side) of the uninterruptible power supply module 3 (uninterruptible power supply module 205) of the uninterruptible power supply device 200. The uninterruptible power supply modules 204 and 205 are examples of a "plurality of uninterruptible power supply modules" in the claims.

In the uninterruptible power supply device 200, the rear side of the uninterruptible power supply module 2 and the rear side of the uninterruptible power supply module 204 are disposed so as to face each other in the Y direction. In the uninterruptible power supply device 200, the rear side of the uninterruptible power supply module 3 and the rear side of the uninterruptible power supply module 205 are disposed so as to face each other in the Y direction. Further, in the uninterruptible power supply device 200, the rear side of the input module 208 and the rear side of the input module 209 are disposed so as to face each other in the Y direction, and the rear side of the bypass module 6 and the rear side of the bypass module 206 are disposed so as to face each other in the Y direction.

Figure 13:
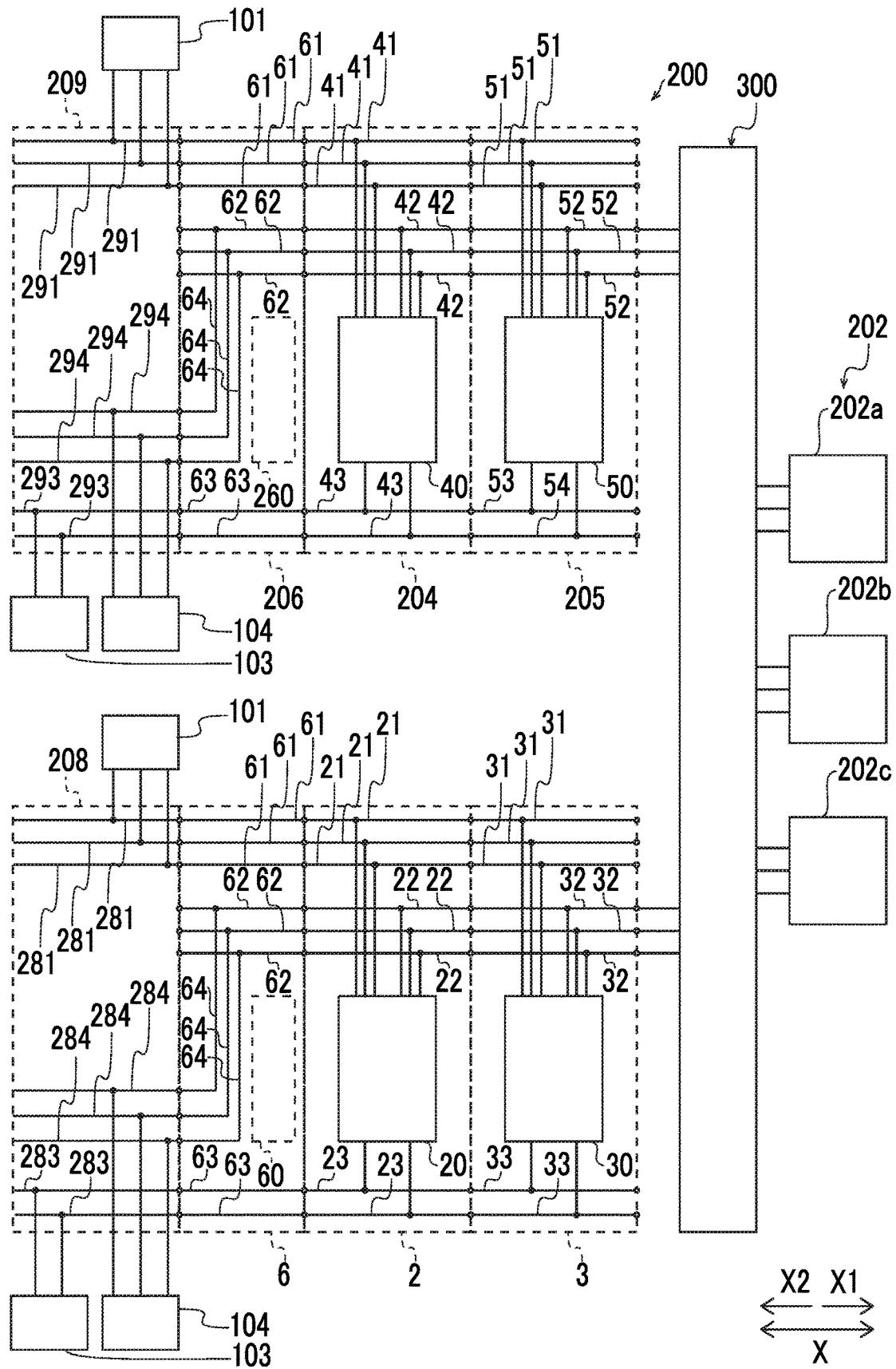
FIG. 13 is a schematic diagram for describing a configuration of the uninterruptible power supply device according to the second embodiment.

As shown in FIG. 13, the input module 208 is configured to be electrically connected to the power conversion units (power conversion units 20 and 30) of the uninterruptible power supply modules 2 and 3, respectively. Further, the input module 209 is configured to be electrically connected to the power conversion units (power conversion units 40 and 50) of the uninterruptible power supply modules 204 and 205, respectively.

As shown in FIG. 13, the bypass module 6 includes a control unit 60. Further, the bypass module 206 includes a control unit 260 as shown in FIG. 13.

In the second embodiment, the control unit 60 is configured to control the power conversion of the entire uninterruptible power supply modules 2 and 3 (power conversion units 20 and 30). Further, the control unit 260 is configured to control the power conversion of the entire uninterruptible power supply modules 204 and 205 (power conversion units 40 and 50). That is, the bypass module 6 and the bypass module 206 are control modules including a plurality of bypass wires 64 (bypass circuits).

The uninterruptible power supply device 200 (uninterruptible power supply module 2) is configured to output the AC power converted by the power conversion unit 20 to the output branch board 300 disposed on the X1 direction side via busbars 22 and busbars 32. Further, the uninterruptible power supply device 200 (uninterruptible power supply module 3) is configured to output the AC power converted by the power conversion unit 30 to the output branch board 300 disposed on the X1 direction side via busbars 32.

Then, the uninterruptible power supply device 200 (uninterruptible power supply module 204) is configured to output the AC power converted by the power conversion unit 40 to the output branch board 300 disposed on the X1 direction side via busbars 42 and busbars 52. Further, the uninterruptible power supply device 200 (uninterruptible power supply module 205) is configured to output the AC power converted by the power conversion unit 50 to the output branch board 300 disposed on the X1 direction side via busbars 52.

That is, the uninterruptible power supply device 200 is configured to output, to the output branch board 300, the AC power converted by the power conversion units (power conversion units 20, 30, 40, and 50) of the uninterruptible power supply modules 2, 3, 204, and 205, respectively. Therefore, as shown in FIGS. 14 and 15, the input module 208 and the input module 209 are not provided with wires for AC output.

Figure 14:
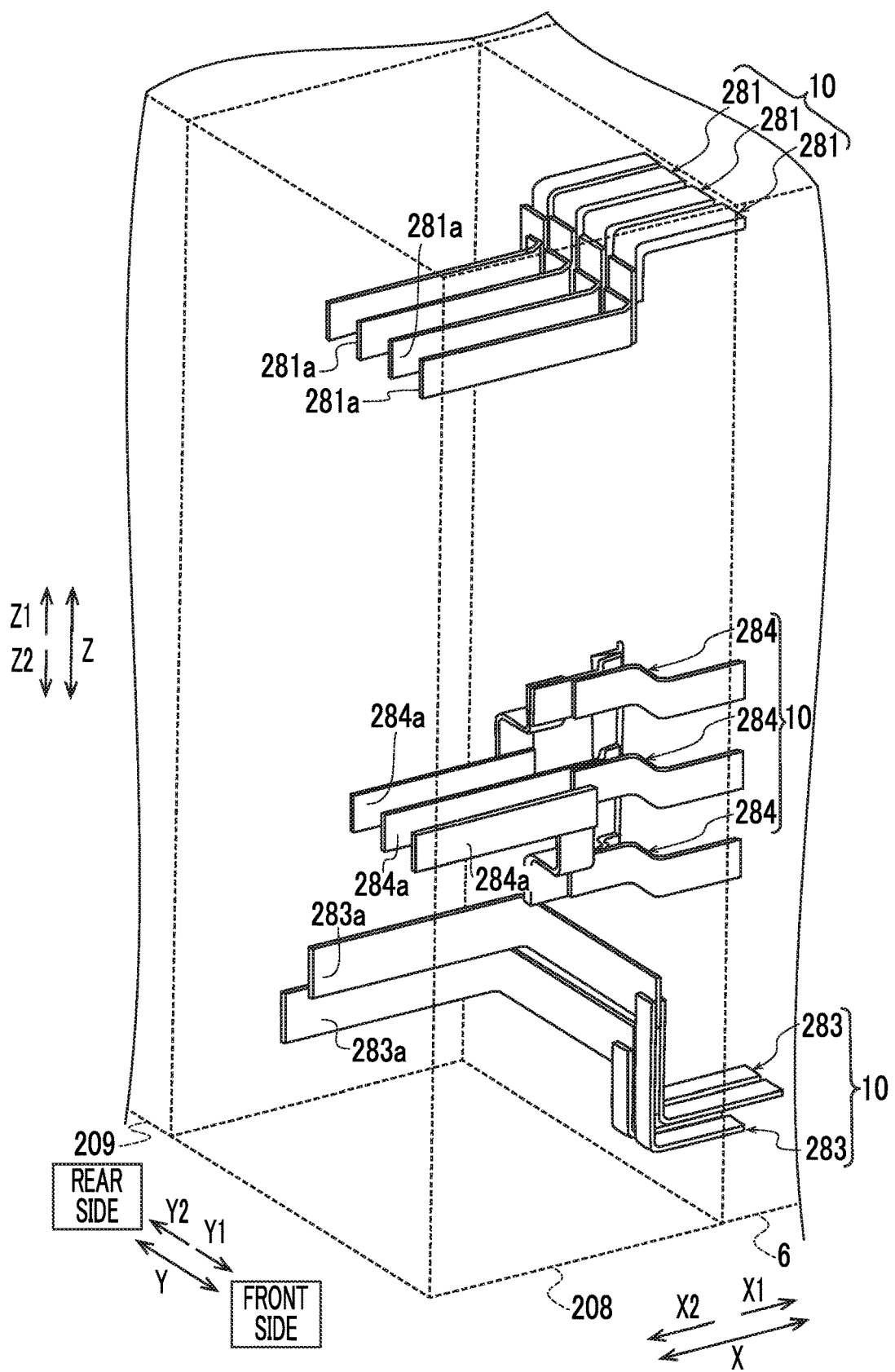
FIG. 14 is a perspective view showing a configuration of a plurality of conductor wires having a plate shape of an input module disposed on a Y1 direction side among input modules according to the second embodiment.
Figure 15:
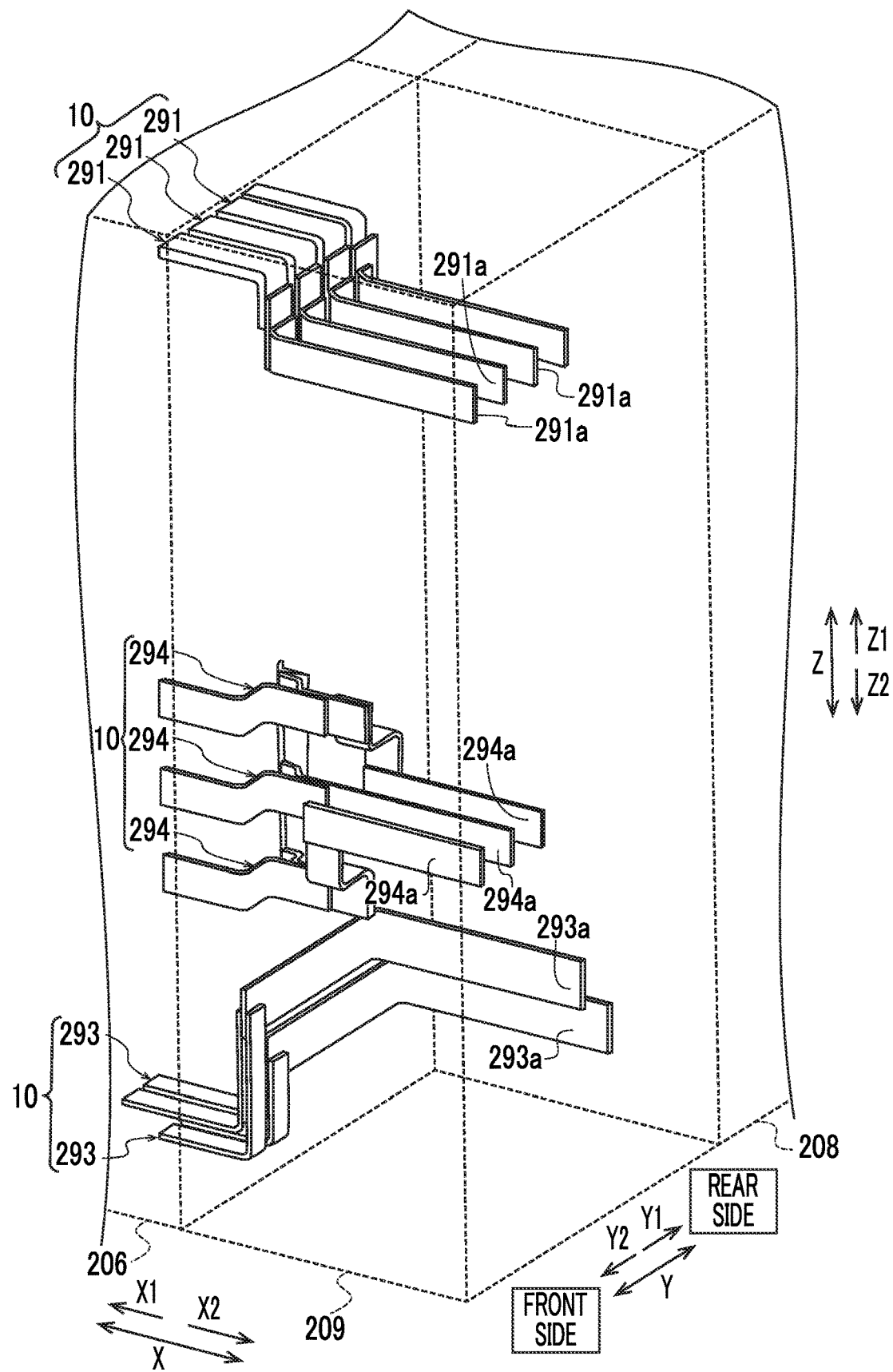
FIG. 15 is a perspective view showing a configuration of a plurality of conductor wires having a plate shape of an input module disposed on a Y2 direction side among input modules according to the second embodiment.

In the uninterruptible power supply device 200, as shown in FIG. 14, a plurality of conductor wires 10 having a plate shape provided in the input module 208 includes a plurality of AC input wires 281, a plurality of DC input wires 283, and a plurality of bypass input wires 284.

As shown in FIG. 14, the plurality of AC input wires 281 each has an AC input cable attachment portion 281a to which the AC input cable 101a (see FIGS. 5 and 6) is attached at the end on the X2 direction side (the other side).

Further, as shown in FIG. 14, the plurality of DC input wires 283 each has a DC input cable attachment portion 283a to which the DC input cable 103a (see FIGS. 5 and 6) is attached at the end on the X2 direction side (the other side).

Further, as shown in FIG. 14, the plurality of bypass input wires 284 each has a bypass input cable attachment portion 284a to which the bypass input cable 104a (see FIGS. 5 and 6) is attached at the end on the X2 direction side (the other side).

Further, in the uninterruptible power supply device 200, as shown in FIG. 15, a plurality of conductor wires 10 having a plate shape provided in the input module 209 includes a plurality of AC input wires 291, a plurality of DC input wires 293, and a plurality of bypass input wires 294.

Further, as shown in FIG. 15, the plurality of AC input wires 291 each has an AC input cable attachment portion 291a to which the AC input cable 101a (see FIGS. 5 and 6) is attached at the end on the X2 direction side (the other side).

Further, as shown in FIG. 15, the plurality of DC input wires 293 each has a DC input cable attachment portion 293a to which the DC input cable 103a (see FIGS. 5 and 6) is attached at the end on the X2 direction side (the other side).

Further, as shown in FIG. 15, the plurality of bypass input wires 294 each has a bypass input cable attachment portion 294a to which the bypass input cable 104a (see FIGS. 5 and 6) is attached at the end on the X2 direction side (the other side).

The output branch board 300 is configured to input the electric power converted by the power conversion units 20, 30, 40, and 50, and is configured to branch the electric power to a load 202 outside the device. For example, loads 202a, 202b, and 202c are connected to the output branch board 300 as the load 202, and the output branch board 300 is configured to branch the input electric power according to each of the connected loads 202a, 202b, and 202c.

An AC power supply 101, a battery 103, and a bypass power supply AC power supply 104 outside the device are connected to each of the input modules 208 and 209 of the uninterruptible power supply device 200, but different AC power supplies, batteries, and bypass power supply AC power supplies may be connected to each of the input modules 208 and 209.

Other configurations of the second embodiment are the same as those of the first embodiment.

Effects of Second Embodiment

In the second embodiment, the following effects can be obtained.

In the second embodiment, as in the first embodiment, it is possible to suppress an increase in the width of the entire uninterruptible power supply device 200 in the X direction in which the uninterruptible power supply modules 2 and 3 (uninterruptible power supply modules 4 and 5) and the input module 208 (input module 209) are adjacent to each other.

Third Embodiment

Figure 16:
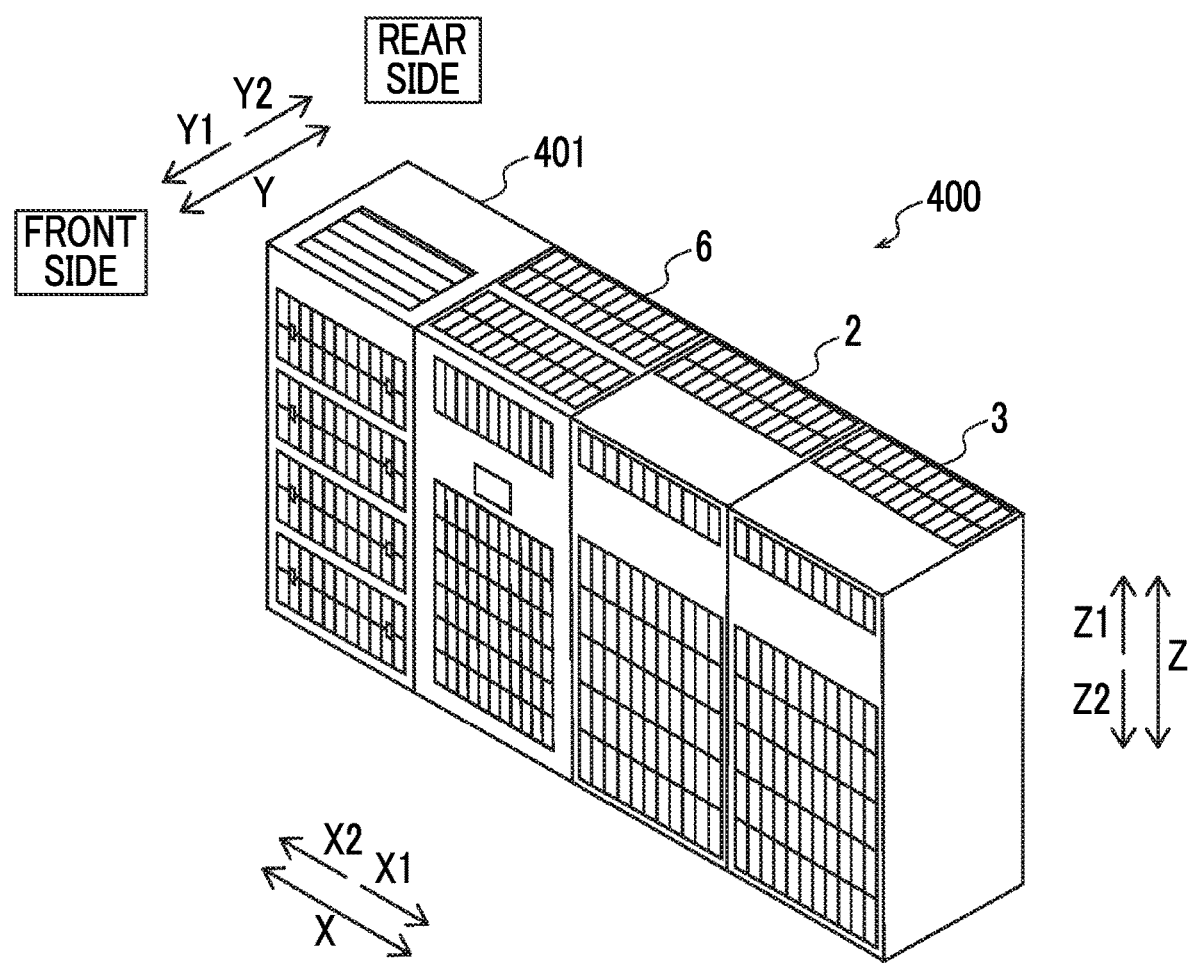
FIG. 16 is a perspective view showing an uninterruptible power supply device according to a third embodiment of the present invention.
Figure 17:
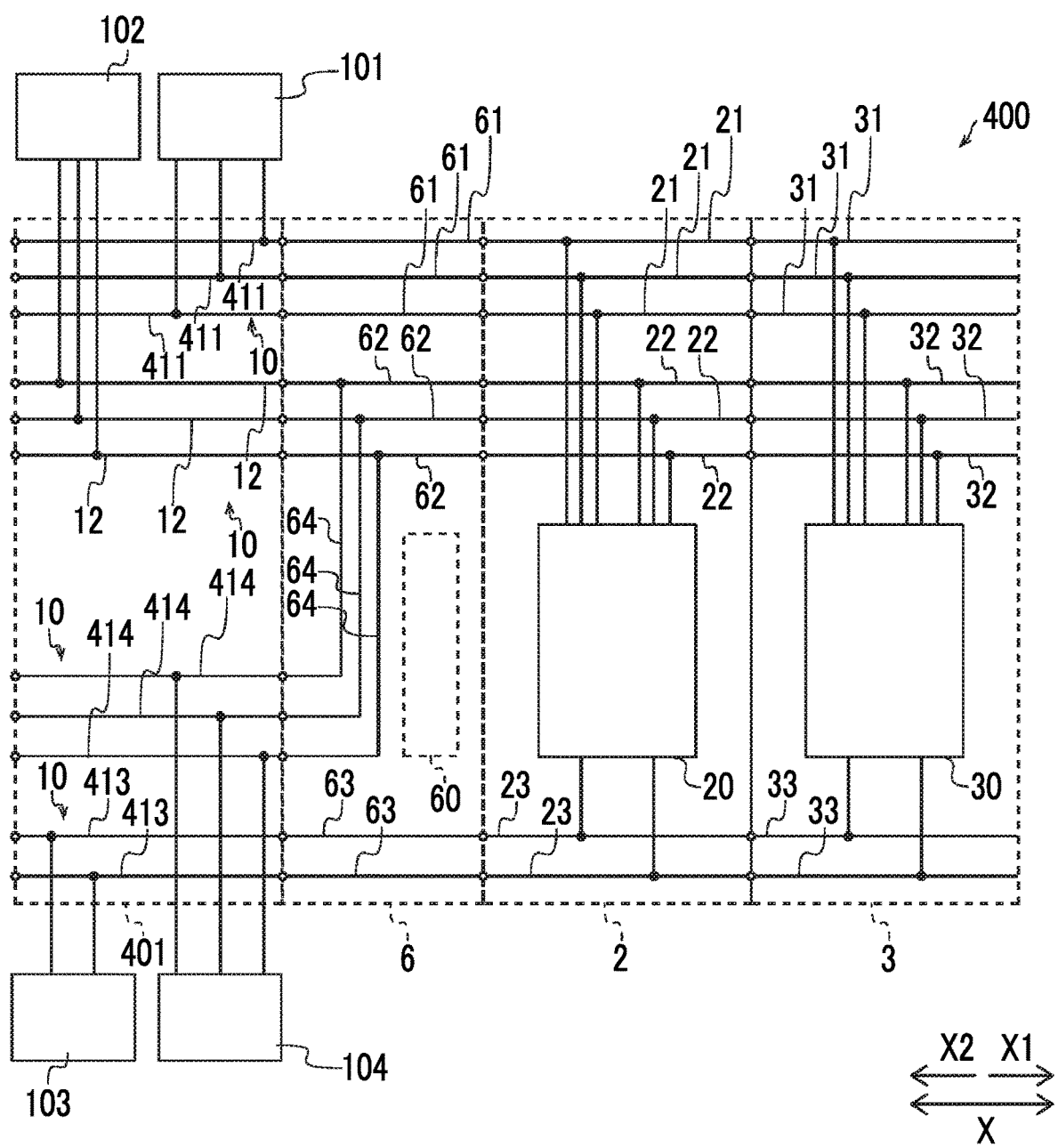
FIG. 17 is a schematic diagram for describing a configuration of the uninterruptible power supply device according to the third embodiment.
Figure 18:
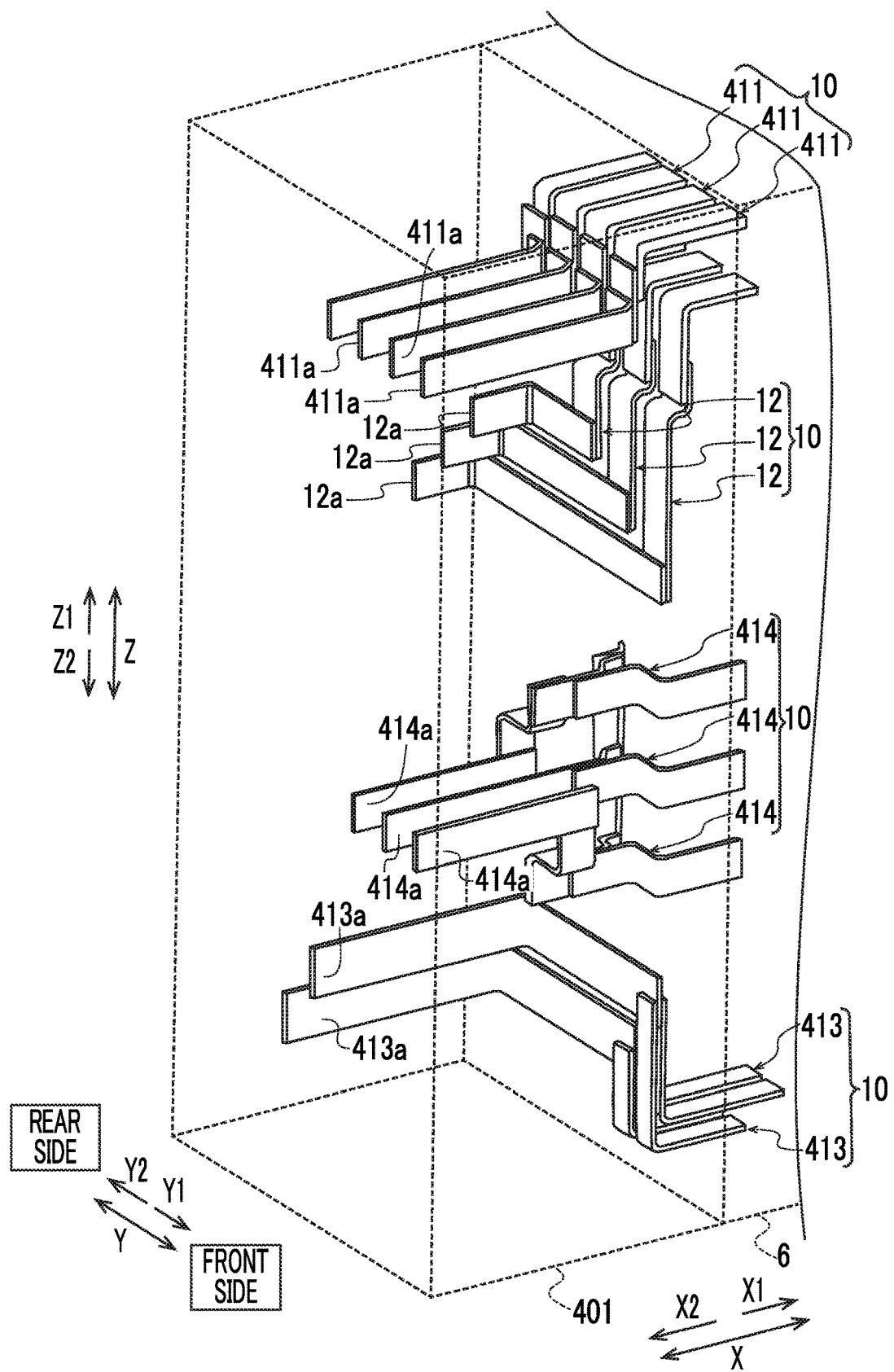
FIG. 18 is a perspective view showing a configuration of the plurality of conductor wires having a plate shape inside the input module according to the third embodiment.

With reference to FIGS. 16 to 18, the overall configuration of an uninterruptible power supply device 400 according to a third embodiment of the present invention will be described. The same components as those in the first and second embodiments are designated by the same reference numerals, and the description thereof will be omitted.

In the uninterruptible power supply device 400 according to the third embodiment, unlike the uninterruptible power supply device 100 according to the first embodiment in which the uninterruptible power supply modules 2 and 3 are disposed on the X1 direction side (one side) of the input module 1, and the uninterruptible power supply modules 4 and 5 are disposed on the X2 direction side (the other side), as shown in FIG. 16, a plurality of uninterruptible power supply modules (uninterruptible power supply modules 2 and 3) is configured to be disposed only on the X1 direction side (one side) of an input module 401.

The uninterruptible power supply device 400 according to the third embodiment includes an input module 401, a bypass module 6, and uninterruptible power supply modules 2 and 3. In the uninterruptible power supply device 400, as shown in FIG. 16, each module is disposed in the order of the input module 401, the bypass module 6, the uninterruptible power supply module 2, and the uninterruptible power supply module 3 from the X2 direction side.

In the uninterruptible power supply device 400, as shown in FIGS. 17 and 18, a plurality of conductor wires 10 having a plate shape provided in the input module 401 includes a plurality of AC input wires 411, a plurality of AC output wires 12, a plurality of DC input wires 413, and a plurality of bypass input wires 414.

As shown in FIG. 18, the plurality of AC input wires 411 each has an AC input cable attachment portion 411a to which the AC input cable 101a (see FIGS. 5 and 6) is attached at the end on the X2 direction side (the other side).

As shown in FIG. 18, the plurality of AC output wires 12 each has an output cable attachment portion 12a to which the output cable 102a (see FIGS. 5 and 6) is attached at the end on the X2 direction side (the other side).

Further, as shown in FIG. 18, the plurality of DC input wires 413 each has a DC input cable attachment portion 413a to which the DC input cable 103a (see FIGS. 5 and 6) is attached at the end on the X2 direction side (the other side).

Further, as shown in FIG. 18, the plurality of bypass input wires 414 each has a bypass input cable attachment portion 414a to which the bypass input cable 104a (see FIGS. 5 and 6) is attached at the end on the X2 direction side (the other side).

Other configurations of the third embodiment are the same as those of the first embodiment.

Effects of Third Embodiment

In the third embodiment, the following effects can be obtained.

In the third embodiment, as in the first embodiment, it is possible to suppress an increase in the width of the entire uninterruptible power supply device 400 in the X direction in which the uninterruptible power supply modules 2 and 3 and the input module 401 are adjacent to each other.

Modification Example

The embodiments disclosed this time should be considered to be exemplary and not restrictive in all respects. The scope of the present invention is shown by the scope of claims rather than the description of the above embodiments, and further includes all modifications (modification examples) within the meaning and scope equivalent to the scope of claims.

For example, in the first embodiment, the plurality of conductor wires 10 having a plate shape provided in the input module 1 includes the plurality of AC input wires 11, the plurality of AC output wires 12, the plurality of DC input wires 13, and the plurality of bypass input wires 14, but the present invention is not limited thereto. For example, the plurality of conductor wires having a plate shape provided in the input module may include only a plurality of AC input wires. Further, in the plurality of conductor wires having a plate shape provided in the input module, any one or more and two or less of the plurality of AC output wires, the plurality of DC input wires, and the plurality of bypass input wires may be included together with the plurality of AC input wires.

Further, in the first embodiment, the DC input cable attachment portion 13a of each of the plurality of DC input wires 13 is disposed so as to be offset in the Y direction (second direction) with respect to the AC input cable attachment portion 11a of each of the plurality of AC input wires 11, but the present invention is not limited thereto. In the present invention, the DC input cable attachment portion of each of the plurality of DC input wires may be disposed so as to overlap the AC input cable attachment portion of each of the plurality of AC input wires when viewed in the vertical direction (Z direction) without being offset in the second direction. Further, the DC input cable attachment portion of each of the plurality of DC input wires may be disposed so as to be offset in the first direction with respect to the AC input cable attachment portion of each of the plurality of AC input wires.

Further, in the first embodiment, the DC input cable attachment portion 13a of each of the plurality of DC input wires 13 is disposed so as to be offset in the Y2 direction (to the rear side) with respect to the AC input cable attachment portion 11a of each of the plurality of AC input wires 11, but the present invention is not limited thereto. In the present invention, the AC input cable attachment portion of each of the plurality of AC input wires may be disposed so as to be offset to the rear side (in the Y2 direction) with respect to the DC input cable attachment portion of each of the plurality of DC input wires.

Further, in the first embodiment, the AC input cable attachment portion 11a of each of the plurality of AC input wires 11 is disposed so as to be offset in the Z direction (vertical direction) with respect to the DC input cable attachment portion 13a of each of the plurality of DC input wires 13, but the present invention is not limited thereto. In the present invention, the AC input cable attachment portion of each of the plurality of AC input wires may be disposed so as to overlap the DC input cable attachment portion of each of the plurality of DC input wires when viewed from the front side or the rear side (in the Y direction) of the input module without being offset in the vertical direction.

Further, in the first embodiment, an example in which the bypass module 6 provided with the plurality of bypass wires 64 and the bypass module 7 provided with the plurality of bypass wires 74 are included has been shown, but the present invention is not limited thereto. In the present invention, a plurality of bypass wires may be provided in the input module. That is, the input module and the bypass module may be integrally configured.

Further, in the first embodiment, an example in which the bypass module 6 is a control module including the plurality of bypass wires 64 (bypass circuits) has been shown, but the present invention is not limited thereto. In the present invention, the uninterruptible power supply device may independently include a bypass module including a plurality of bypass wires and a control module including a control unit.

Further, in the first embodiment, the bypass input cable attachment portion 14a of each of the plurality of bypass input wires 14 is disposed so as to be offset in the Y direction (second direction) with respect to the DC input cable attachment portion 13a of each of the plurality of DC input wires 13, but the present invention is not limited thereto. In the present invention, the bypass input cable attachment portion of each of the plurality of bypass input wires may be disposed so as to overlap the DC input cable attachment portion of each of the plurality of DC input wires when viewed in the vertical direction (Z direction) without being offset in the second direction. Further, the bypass input cable attachment portion of each of the plurality of bypass input wires may be disposed so as to be offset in the first direction with respect to the DC input cable attachment portion of each of the plurality of DC input wires.

Further, in the first embodiment, the bypass input cable attachment portion 14a of each of the plurality of bypass input wires 14 is disposed so as to be offset in the Y1 direction (to the front side) with respect to the DC input cable attachment portion 13a of each of the plurality of DC input wires 13, but the present invention is not limited thereto. In the present invention, the DC input cable attachment portion of each of the plurality of DC input wires may be disposed so as to be offset to the front side (in the Y1 direction) with respect to the bypass input cable attachment portion of each of the plurality of bypass input wires.

Further, in the first embodiment, the AC input cable attachment portions 11a of the plurality of AC input wires 11 are disposed so as to overlap each other when viewed in the Y direction (second direction), but the present invention is not limited thereto. In the present invention, the AC input cable attachment portions of the plurality of AC input wires may be disposed so as to be offset in the vertical direction.

Further, in the first embodiment, the bypass input cable attachment portions 14a of the plurality of bypass input wires 14 are disposed so as to overlap each other when viewed in the Y direction (second direction), but the present invention is not limited thereto. In the present invention, the bypass input cable attachment portions of the plurality of bypass input wires may be disposed so as to be offset in the vertical direction.

Further, in the first embodiment, the DC input cable attachment portions 13a of the plurality of DC input wires 13 are disposed so as to be offset in the Z direction (vertical direction), but the present invention is not limited thereto. In the present invention, the DC input cable attachment portions of the plurality of DC input wires may be disposed so as to overlap each other when viewed in the second direction (Y direction).

Further, in the first embodiment, an example in which the bypass module 6 and the bypass module 7 are included has been shown, but the present invention is not limited thereto. In the present invention, the uninterruptible power supply device may be configured to include only one bypass module. In this case, the plurality of one-sided uninterruptible power supply modules and the plurality of other-sided uninterruptible power supply modules may be configured to be electrically connected to a plurality of bypass wires provided in one (same) bypass module.

Further, in the first embodiment, an example in which the output cable attachment portion 12a of each of the plurality of AC output wires 12 is disposed so as to be offset in the Y direction (second direction) with respect to the AC input cable attachment portion 11a of each of the plurality of AC input wires 11 and the bypass input cable attachment portion 14a of each of the plurality of bypass input wires 14 has been shown, but the present invention is not limited thereto. In the present invention, the output cable attachment portion of each of the plurality of AC output wires may be disposed so as to overlap the AC input cable attachment portion of each of the plurality of AC input wires or the bypass input cable attachment portion of each of the plurality of bypass input wires when viewed in the vertical direction (Z direction) without being offset in the second direction. Further, the output cable attachment portion of each of the plurality of AC output wires may be disposed so as to be offset in the first direction with respect to the AC input cable attachment portion of each of the plurality of AC input wires or the bypass input cable attachment portion of each of the plurality of bypass input wires.

Further, in the first embodiment, an example in which the output cable attachment portion 12a of each of the plurality of AC output wires 12 is disposed so as to be offset in the Y2 direction (the rear side) with respect to the AC input cable attachment portion 11a of each of the plurality of AC input wires 11 and the bypass input cable attachment portion 14a of each of the plurality of bypass input wires 14 has been shown, but the present invention is not limited thereto. In the present invention, the output cable attachment portion of each of the plurality of AC output wires may be disposed so as to be offset in the front side (Y1 direction) with respect to the AC input cable attachment portion of each of the plurality of AC input wires or the bypass input cable attachment portion of each of the plurality of bypass input wires.

Figure 19:
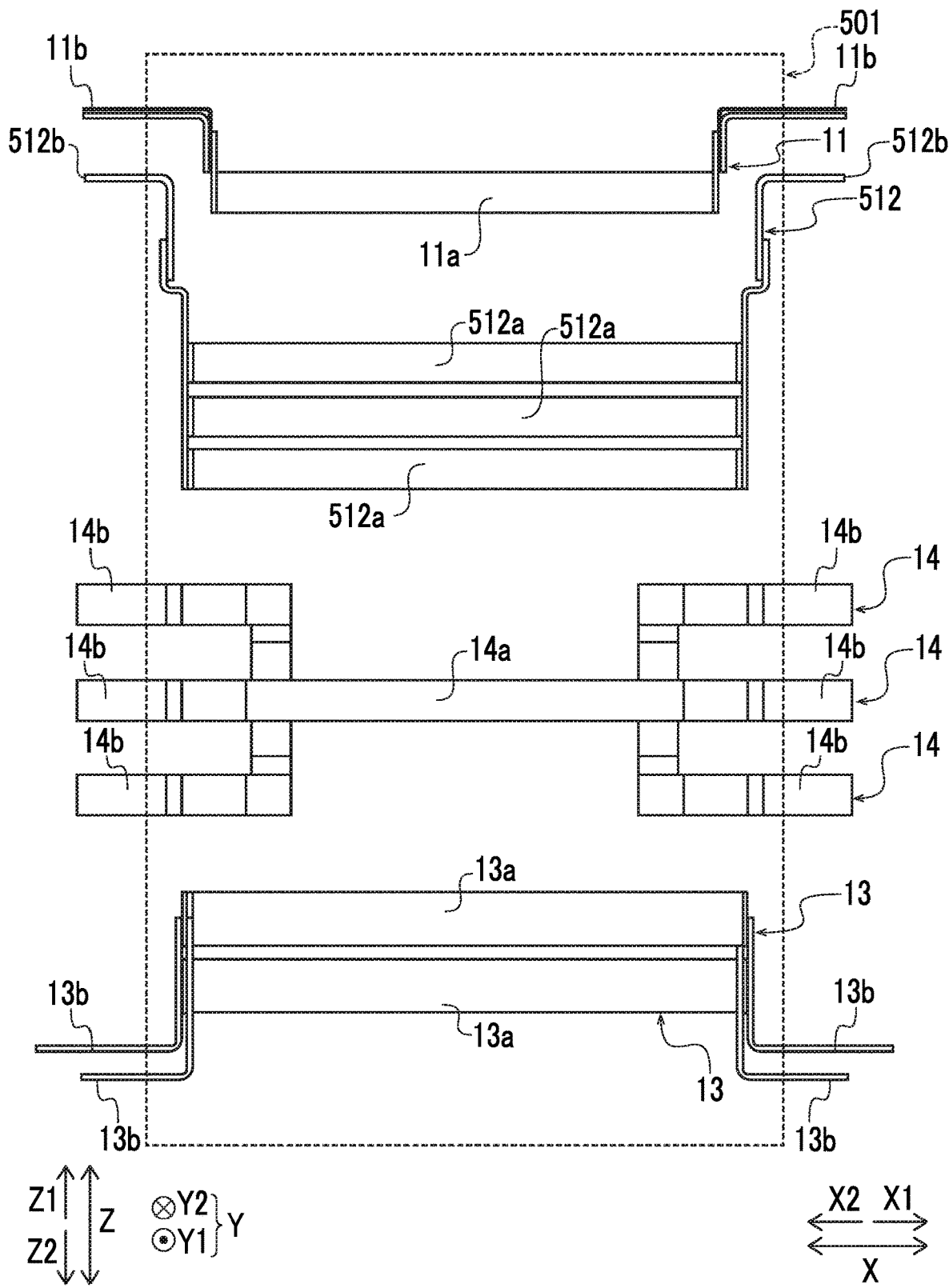
FIG. 19 is a front view showing a configuration of a plurality of AC output wires inside an input module according to a first modification example.

Further, in the first embodiment, an example in which the plurality of AC output wires 12 is divided into the X1 direction side (one side) and the X2 direction side (the other side) has been shown, but the present invention is not limited thereto. In the present invention, as in an input module 501 according to a first modification example shown in FIG. 19, a plurality of AC output wires 512 may be formed so as to extend from one side (X1 direction side) to the other side (X2 direction side). For example, as shown in FIG. 19, the AC output wires 512 are formed so as to be line-symmetrical (left-right symmetric) with respect to an axis (central axis of the input module 501) along the Z direction (vertical direction). Further, the AC output wire 512 has busbar connection portions 512b at an end on the X2 direction side and an end on the X1 direction side, and has output cable attachment portions 512a between the busbar connection portions 512b.

What is claimed is:

1. An uninterruptible power supply device comprising:
    an input module provided with a plurality of conductor wires having a plate shape and including a plurality of AC input wires provided at least in correspondence with phases of electric power supplied from an AC power supply outside a device; and
    a plurality of uninterruptible power supply modules each including a power conversion unit that converts electric power received from the AC power supply outside the device via the plurality of AC input wires and outputs the converted electric power to a load outside the device,
    wherein each of the plurality of AC input wires has AC input cable attachment portions to which an AC input cable electrically connected to the AC power supply outside the device is attached,
    the AC input cable attachment portions extend in a first direction in which the plurality of uninterruptible power supply modules and the input module are adjacent to each other,
    the AC input cable attachment portions are disposed so as to be separated from each other in a second direction, which is a direction in which a front side and a rear side of the input module face each other, and
    the AC input cable attachment portions are disposed so that attaching surfaces of the AC input cable attachment portions are orthogonal to the second direction.

2. The uninterruptible power supply device according to claim 1,
    wherein the plurality of conductor wires having the plate shape further includes a plurality of DC input wires provided in correspondence with phases of electric power supplied from a battery outside the device,
    each of the plurality of DC input wires extends in the first direction and has a DC input cable attachment portion to which a DC input cable electrically connected to the battery outside the device is attached, and
    the DC input cable attachment portions are disposed so as to be separated from each other in the second direction.

3. The uninterruptible power supply device according to claim 2,
    wherein the DC input cable attachment portion of each of the plurality of DC input wires is disposed so as to be offset in the second direction with respect to the AC input cable attachment portion of each of the plurality of AC input wires.

4. The uninterruptible power supply device according to claim 2,
    wherein the AC input cable attachment portion of each of the plurality of AC input wires is disposed so as to be offset in a vertical direction with respect to the DC input cable attachment portion of each of the plurality of DC input wires.

5. The uninterruptible power supply device according to claim 2, further comprising a bypass module provided with a plurality of bypass wires provided in correspondence with phases of electric power supplied from an AC power supply for bypass power supply outside the device to output the electric power from the AC power supply for bypass power supply to the load outside the device not via the power conversion unit, wherein the plurality of conductor wires having the plate shape further includes a plurality of bypass input wires provided in correspondence with the plurality of bypass wires, each of the plurality of bypass input wires extends in the first direction and has bypass input cable attachment portions to which a bypass input cable electrically connected to the AC power supply for bypass power supply outside the device is attached, and the bypass input cable attachment portions are disposed so as to be separated from each other in the second direction.

6. The uninterruptible power supply device according to claim 5, wherein each of the bypass input cable attachment portions of the plurality of bypass input wires is disposed so as to be offset in the second direction with respect to each of the DC input cable attachment portions of the plurality of DC input wires.

7. The uninterruptible power supply device according to claim 5, wherein each of the DC input cable attachment portions of the plurality of DC input wires is disposed so as to be offset in a vertical direction.

8. An uninterruptible power supply device comprising:

an input module provided with a plurality of conductor wires having a plate shape and including a plurality of AC input wires provided at least in correspondence with phases of electric power supplied from an AC power supply outside a device;

a plurality of uninterruptible power supply modules each including a power conversion unit that converts electric power received from the AC power supply outside the device via the plurality of AC input wires and outputs the converted electric power to a load outside the device; and a bypass module provided with a plurality of bypass wires provided in correspondence with phases of electric power supplied from an AC power supply for bypass power supply outside the device to output the electric power from the AC power supply for bypass power supply to the load outside the device not via the power conversion unit, wherein each of the plurality of AC input wires extends in a first direction in which the plurality of uninterruptible power supply modules and the input module are adjacent to each other, and has AC input cable attachment portions to which an AC input cable electrically connected to the AC power supply outside the device is attached, the AC input cable attachment portions are disposed so as to be separated from each other in a second direction, which is a direction in which a front side and a rear side of the input module face each other, the plurality of conductor wires having the plate shape further includes the plurality of bypass input wires provided in correspondence with the plurality of bypass wires, each of the plurality of bypass input wires extends in the first direction and has bypass input cable attachment portions to which a bypass input cable electrically connected to the AC power supply for bypass power supply outside the device is attached, the bypass input cable attachment portions are disposed so as to be separated from each other in the second direction, the plurality of uninterruptible power supply modules includes a plurality of one-sided uninterruptible power supply modules disposed on one side of the input module in the first direction, and a plurality of another-sided uninterruptible power supply modules disposed on another side of the input module in the first direction, the plurality of AC input wires is electrically connected to a one-sided power conversion unit which is the power conversion unit of each of the plurality of one-sided uninterruptible power supply modules, and another-sided power conversion unit which is the power conversion unit of each of the plurality of another-sided uninterruptible power supply modules, and the electric power from the AC power supply outside the device is configured to be input to each of the one-sided power conversion unit and the another-sided power conversion unit via the AC input cable attachment portion extending from the one side to the another side of each of the plurality of AC input wires.

9. The uninterruptible power supply device according to claim 8, wherein the plurality of DC input wires is electrically connected to the one-sided power conversion unit of each of the plurality of one-sided uninterruptible power supply modules, and the another-sided power conversion unit of each of the plurality of another-sided uninterruptible power supply modules, and the electric power from the battery outside the device is configured to be input to each of the one-sided power conversion unit and the another-sided power conversion unit via the DC input cable attachment portion extending from the one side to the another side of each of the plurality of DC input wires.

10. The uninterruptible power supply device according to claim 8, wherein the bypass module includes a plurality of bypass modules, the plurality of bypass modules includes a one-sided bypass module disposed between the input module and the plurality of one-sided uninterruptible power supply modules, and another-sided bypass module disposed between the input module and the plurality of another-sided uninterruptible power supply modules, the plurality of bypass input wires is electrically connected to a plurality of one-sided bypass wires of the one-sided bypass module as the plurality of bypass wires and a plurality of another-sided bypass wires of the another-sided bypass module as the plurality of bypass wires, and the electric power from the bypass power supply AC power supply outside the device is configured to be input to each of the plurality of one-sided bypass wires and the plurality of another-sided bypass wires via the bypass input cable attachment portion extending from the one side to the another side of each of the plurality of bypass input wires.

11. The uninterruptible power supply device according to claim 10, wherein the plurality of conductor wires having the plate shape further includes a plurality of AC output wires that is converted and output by the one-sided power conversion unit and the another-sided power conversion unit and that is provided in correspondence with phases of the output electric power, each of the plurality of AC output wires extends in the first direction and has an output cable attachment portion to which an output cable electrically connected to the load outside the device is attached, and each of the output cable attachment portions of the plurality of AC output wires is disposed so as to be separated from each other in the second direction.

12. The uninterruptible power supply device according to claim 11, wherein each of the output cable attachment portions of the plurality of AC output wires is disposed so as to be offset in the second direction with respect to the AC input cable attachment portion of each of the plurality of AC input wires and the bypass input cable attachment portion of each of the plurality of bypass input wires.

13. The uninterruptible power supply device according to claim 1, wherein each the plurality of conductor wires has the plate shape with a main surface, and the conductor wires are arranged side by side such that the main surfaces face upwardly, and each of the AC input cable attachment portions has a plate shape with a main surface, and the AC input cable attachment portions are arranged side by side such that the main surfaces thereof face sideward and are attached to the plurality of conductor wires.

* * * * *